(12) United States Patent
Yasukawa et al.

(10) Patent No.: US 12,362,534 B2
(45) Date of Patent: Jul. 15, 2025

(54) SEMICONDUCTOR LASER DRIVING APPARATUS, ELECTRONIC EQUIPMENT, AND MANUFACTURING METHOD OF SEMICONDUCTOR LASER DRIVING APPARATUS

(71) Applicant: SONY SEMICONDUCTOR SOLUTIONS CORPORATION, Kanagawa (JP)

(72) Inventors: Hirohisa Yasukawa, Kanagawa (JP); Nobuaki Kaji, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 752 days.

(21) Appl. No.: 17/626,271

(22) PCT Filed: Jun. 8, 2020

(86) PCT No.: PCT/JP2020/022472
§ 371 (c)(1),
(2) Date: Jan. 11, 2022

(87) PCT Pub. No.: WO2021/019914
PCT Pub. Date: Feb. 4, 2021

(65) Prior Publication Data
US 2022/0294182 A1    Sep. 15, 2022

(30) Foreign Application Priority Data
Jul. 30, 2019    (JP) .................................. 2019-139299

(51) Int. Cl.
*H01S 5/024*    (2006.01)
*H01S 5/02345*    (2021.01)
*H01S 5/026*    (2006.01)

(52) U.S. Cl.
CPC ...... *H01S 5/02345* (2021.01); *H01S 5/02469* (2013.01); *H01S 5/0261* (2013.01)

(58) Field of Classification Search
CPC ............. H01S 5/02469; H01S 5/02345; H01S 5/0261; H01S 5/02315
See application file for complete search history.

(56) References Cited

U.S. PATENT DOCUMENTS 6,940,722 B2 *    9/2005    Tetsuka .................. H01L 23/427
                                                            361/708
12,132,061 B2 *    10/2024    Watanabe ............... H01L 23/04
(Continued)

FOREIGN PATENT DOCUMENTS

CN    202423821 U    9/2012
JP    S62-124780    6/1987
(Continued)

OTHER PUBLICATIONS

International Search Report prepared by the Japan Patent Office on Aug. 19, 2020, for International Application No. PCT/JP2020/022472, 3 pgs.

*Primary Examiner* — Xinning(Tom) Niu
*Assistant Examiner* — Delma R Forde
(74) *Attorney, Agent, or Firm* — Sheridan Ross PC

(57) ABSTRACT

An object of the present technique is to obtain excellent heat radiation characteristics with a simple structure in a semiconductor laser driving apparatus. A semiconductor laser driving apparatus includes a substrate, a laser driver, and a semiconductor laser. The substrate incorporates the laser driver. The semiconductor laser is mounted on one surface of the substrate. Connection wiring electrically connects the laser driver and the semiconductor laser to each other with a wiring inductance of 0.5 nanohenries or less. Side walls surround a region including the semiconductor laser on the (Continued)

surface of the substrate where the semiconductor laser is mounted. The side walls have a heat storage material therein.

20 Claims, 19 Drawing Sheets

(56) References Cited

U.S. PATENT DOCUMENTS

| | | |
|---|---|---|
| 2012/0001166 A1 | 1/2012 | Doany |
| 2013/0022069 A1* | 1/2013 | Lee ................... H01S 5/02255 |
| | | 372/38.02 |
| 2013/0163627 A1 | 6/2013 | Seurin |
| 2013/0213697 A1 | 8/2013 | Palaniswamy et al. |
| 2013/0320390 A1 | 12/2013 | Palaniswamy et al. |
| 2016/0043294 A1 | 2/2016 | Palaniswamy et al. |
| 2016/0130492 A1 | 5/2016 | Matsumura et al. |
| 2016/0156213 A1 | 6/2016 | Yajima et al. |
| 2017/0102508 A1 | 4/2017 | Yoda et al. |
| 2018/0010861 A1* | 1/2018 | Wakaoka ............... H01L 23/427 |
| 2018/0366903 A1 | 12/2018 | Miyata et al. |
| 2019/0067972 A1 | 2/2019 | Yajima et al. |
| 2020/0044472 A1 | 2/2020 | Yajima et al. |
| 2020/0083143 A1* | 3/2020 | Tsai ........................ H01L 24/16 |
| 2024/0112982 A1* | 4/2024 | Makino ............. H01L 27/14618 |

FOREIGN PATENT DOCUMENTS

| | | | |
|---|---|---|---|
| JP | H11186668 A | 7/1999 | |
| JP | 2007-287801 | 11/2007 | |
| JP | 2008-021899 | 1/2008 | |
| JP | 2008-041756 | 2/2008 | |
| JP | 2009-239166 | 10/2009 | |
| JP | 2010-040802 | 2/2010 | |
| JP | 2012-059952 | 3/2012 | |
| JP | 5139916 B2 * | 2/2013 | ............. H01L 33/64 |
| JP | 2013-143517 | 7/2013 | |
| JP | 2013-254813 | 12/2013 | |
| JP | 2015-029036 | 2/2015 | |
| JP | 2015-194689 | 11/2015 | |
| JP | 2016-162912 | 9/2016 | |
| JP | 2017-163371 * | 9/2017 | ............... H03B 9/12 |
| JP | 2019-004025 | 1/2019 | |
| WO | WO 2015/087620 | 6/2015 | |
| WO | WO-2022190623 A1 * | 9/2022 | ....... H01L 27/14618 |

* cited by examiner

FIG. 3
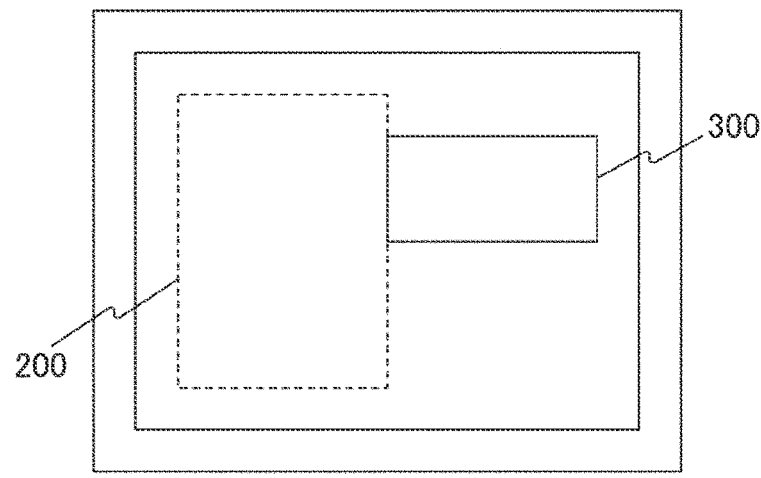
a    OVERLAP: 0%
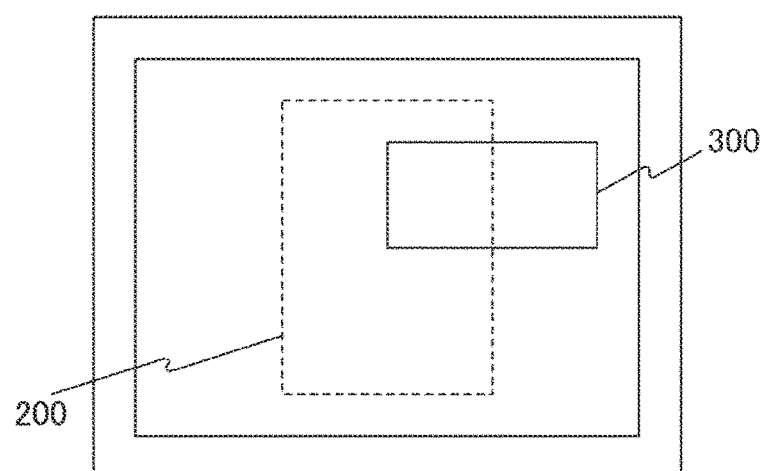
b    OVERLAP: 50%
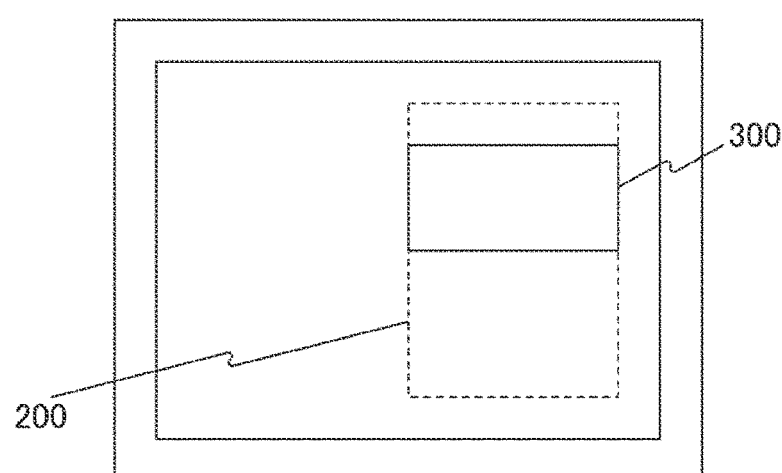
c    OVERLAP: 100%

FIG.4

ADDITIVE METHOD (H=15μm)

| | | L | | | | |
|---|---|---|---|---|---|---|
| | | 0.3mm | 0.5mm | 1mm | 2mm | 3mm |
| W | 0.015mm | 0.21 | 0.40 | 0.94 | 2.16 | 3.48 |
| | 0.05mm | 0.16 | 0.33 | 0.79 | 1.85 | 3.02 |
| | 0.1mm | 0.13 | 0.27 | 0.68 | 1.63 | 2.69 |
| | 0.2mm | 0.09 | 0.21 | 0.56 | 1.39 | 2.33 |
| | 0.3mm | 0.07 | 0.17 | 0.48 | 1.24 | 2.11 |

FIG.5

SUBTRACTIVE METHOD (H=35μm)

|   |   | \multicolumn{5}{c}{L} |   |   |   |   |
|---|---|---|---|---|---|---|
|   |   | 0.3mm | 0.5mm | 1mm | 2mm | 3mm |
| W | 0.035mm | 0.16 | 0.32 | 0.77 | 1.82 | 2.98 |
|   | 0.05mm | 0.15 | 0.30 | 0.73 | 1.75 | 2.86 |
|   | 0.1mm | 0.12 | 0.25 | 0.65 | 1.57 | 2.59 |
|   | 0.2mm | 0.09 | 0.20 | 0.54 | 1.35 | 2.27 |
|   | 0.3mm | 0.07 | 0.17 | 0.47 | 1.22 | 2.07 |

F I G . 6
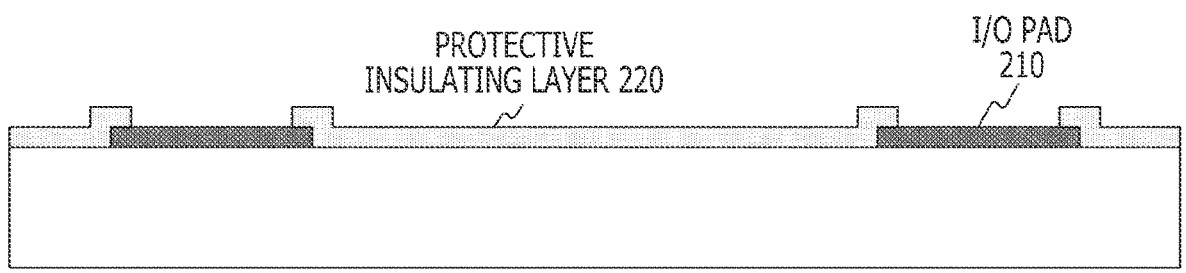
a
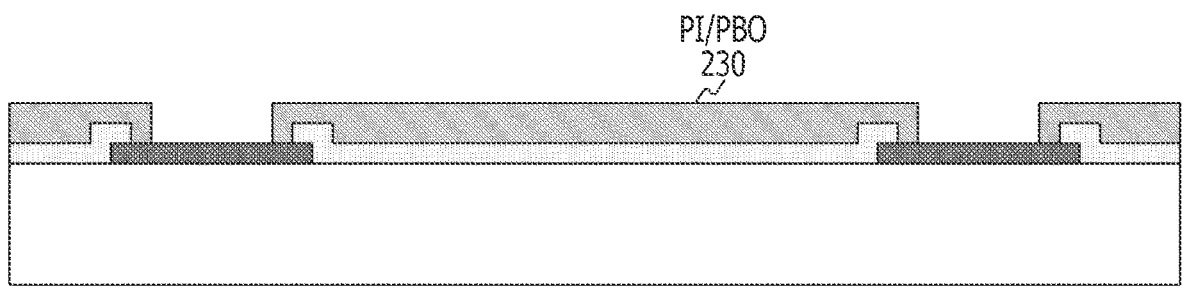
b
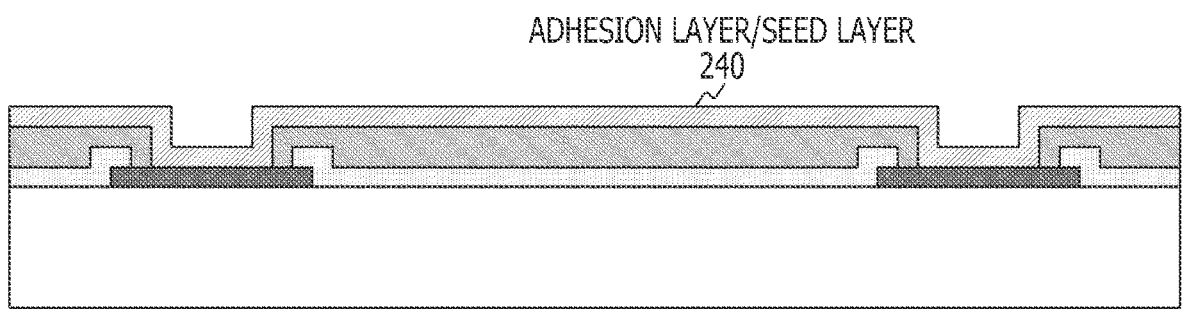
c

FIG.9
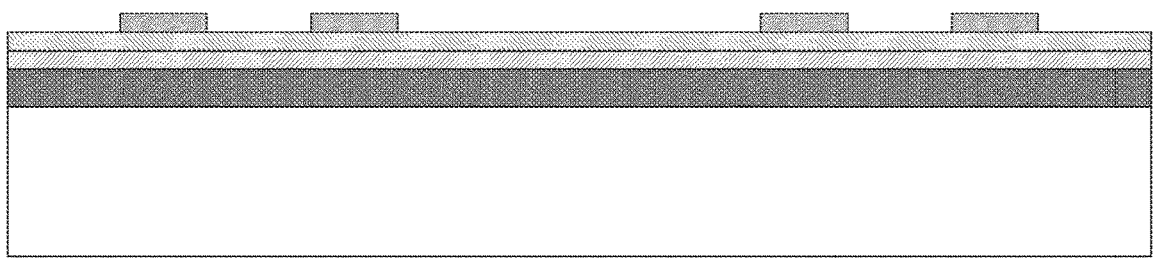
e
INTERLAYER INSULATING RESIN 161
f
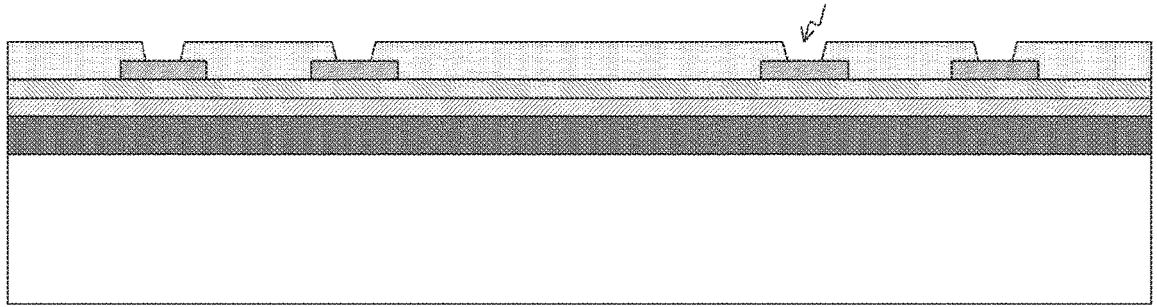
VIA HOLE 170
g
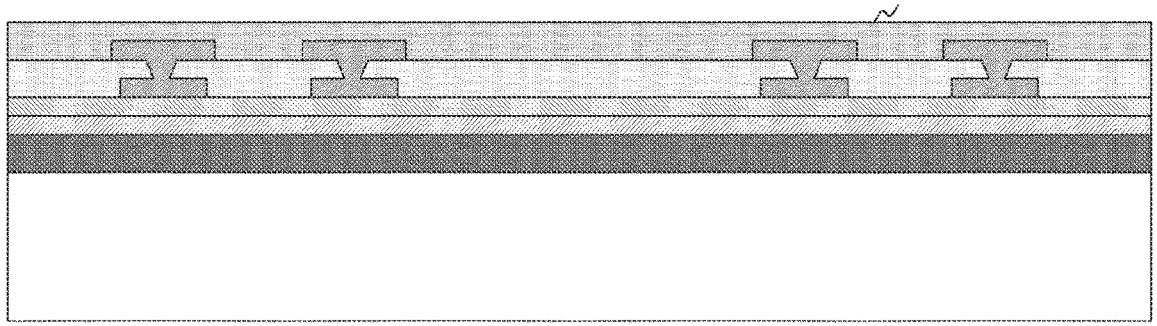
INTERLAYER INSULATING RESIN 162
h FIG.11
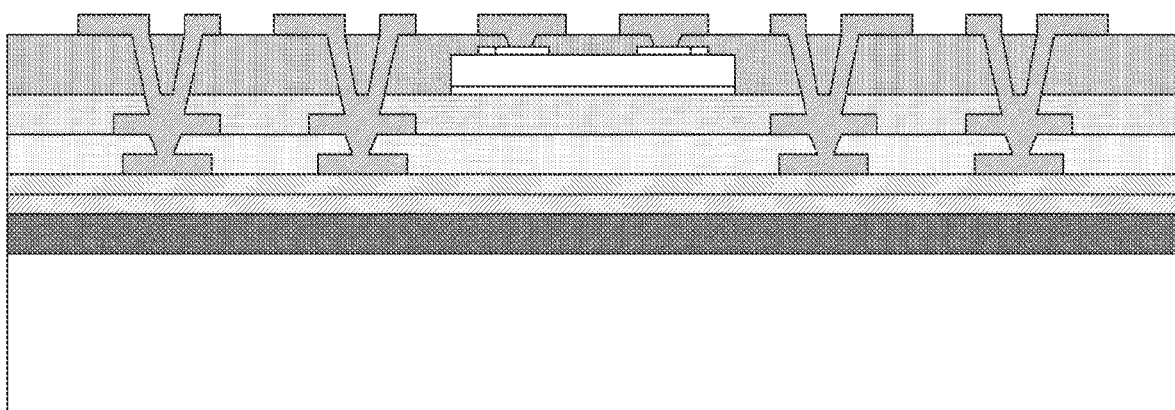
l
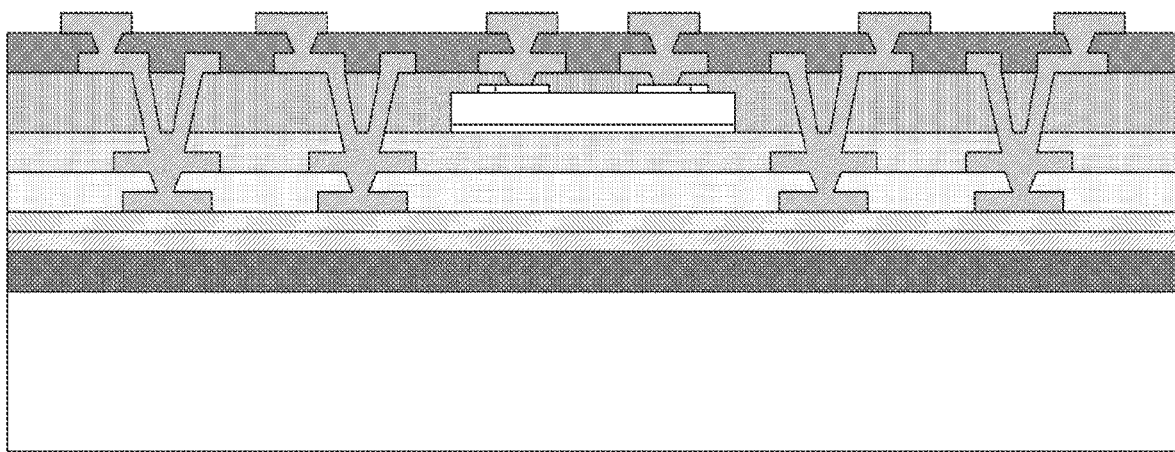
m
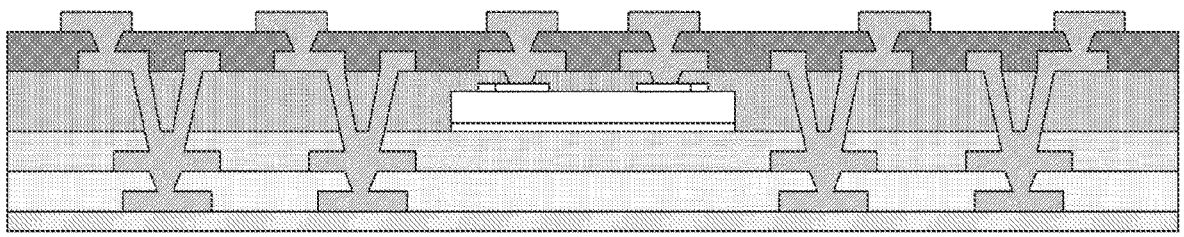
n FIG.12
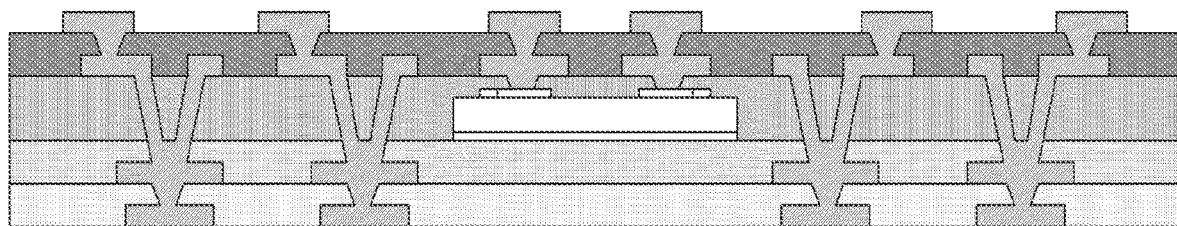
o
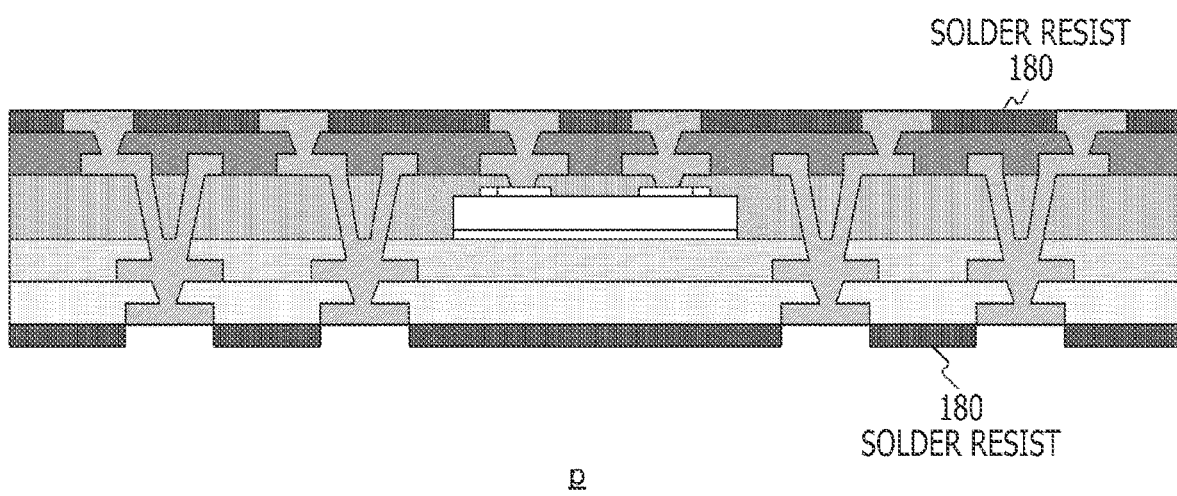
p

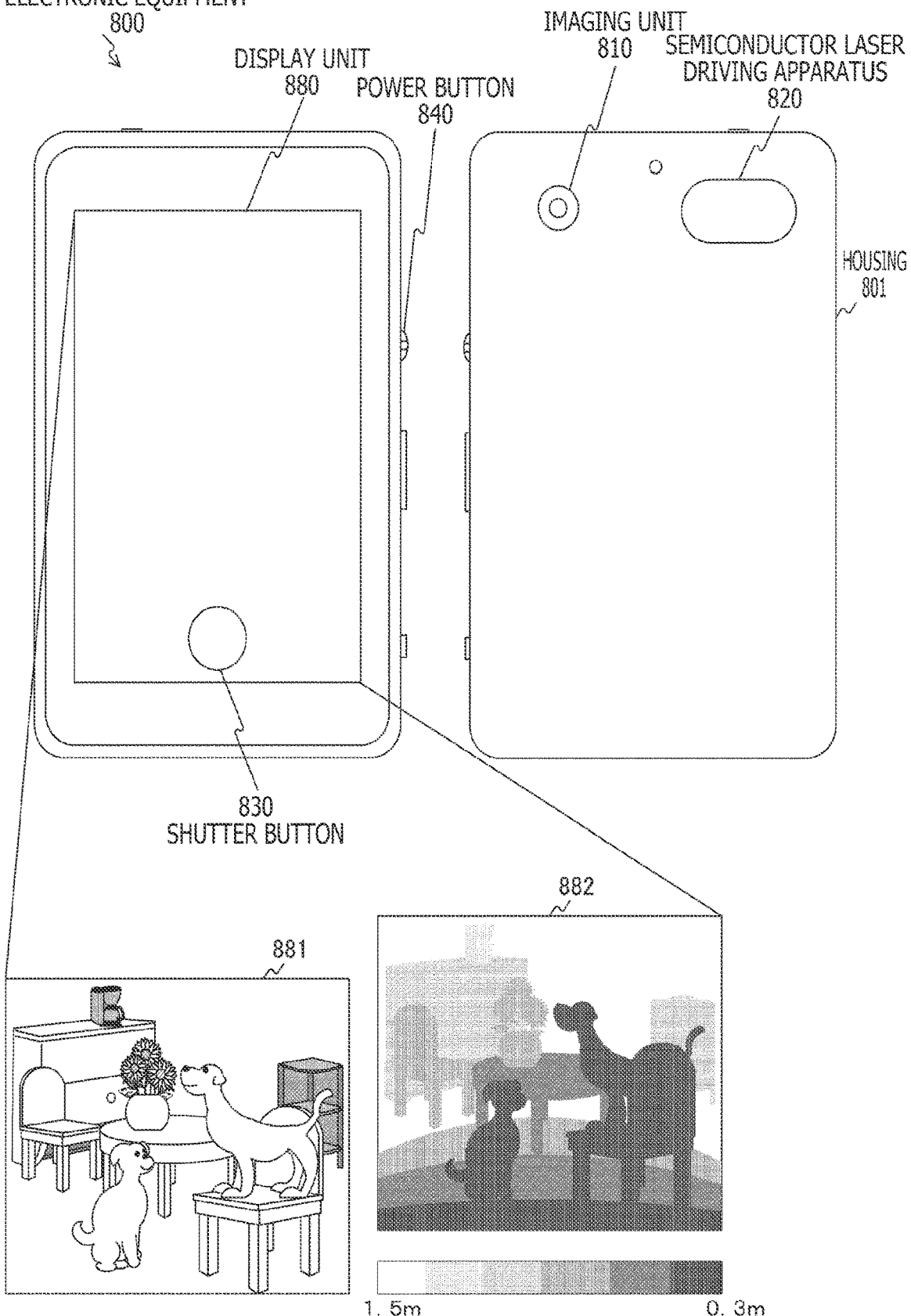

SEMICONDUCTOR LASER DRIVING APPARATUS, ELECTRONIC EQUIPMENT, AND MANUFACTURING METHOD OF SEMICONDUCTOR LASER DRIVING APPARATUS

CROSS REFERENCE TO RELATED APPLICATIONS

This application is a national stage application under 35 U.S.C. 371 and claims the benefit of PCT Application No. PCT/JP2020/022472 having an international filing date of 8 Jun. 2020, which designated the United States, which PCT application claimed the benefit of Japanese Patent Application No. 2019-139299 filed 30 Jul. 2019, the entire disclosures of each of which are incorporated herein by reference.

TECHNICAL FIELD

The present technique relates to a semiconductor laser driving apparatus. Specifically, the present technique relates to a semiconductor laser driving apparatus and electronic equipment including a substrate incorporating a laser driver and a semiconductor laser and a manufacturing method of the semiconductor laser driving apparatus.

BACKGROUND ART

One of the basic characteristics of a semiconductor laser is the output characteristic of laser light with respect to the injected current, which is generally called the I-L characteristic of the semiconductor laser. When a threshold current Ith (oscillation start current) at which the laser starts to emit light is exceeded, laser oscillation starts, and light output rapidly and linearly increases along with the applied current. In practice, it is better to make the threshold current smaller. In addition, the ratio (inclination) of an increase ΔL in light output to an increase ΔI in current is called differential quantum efficiency ηp [mW/mA], and represents the degree of an increase in light intensity when the current is increased. The greater the inclination, the better the characteristics. The semiconductor laser is susceptible to a temperature rise, and the deterioration of the semiconductor laser caused by the increased threshold current, the output drop due to deteriorated differential quantum efficiency, or the like can be confirmed. As a cooling mechanism for such a semiconductor laser driving apparatus, an air-cooled type in which heat generated in the semiconductor laser driving apparatus is radiated by air, or a water-cooled type used by being connected to a circulating cooling water supply apparatus (chiller) and the like has been known.

For example, proposed is a laser driving apparatus that includes a semiconductor laser heat-radiation member for radiating heat generated from a semiconductor laser array; a fiber laser heat-radiation member for radiating heat generated from an optical fiber for a fiber laser; a cooling fan for blowing cooling air; and a guide member for guiding the cooling air blown from the cooling fan (refer to, for example, PTL 1). In addition, proposed is an electronic equipment cooling structure that has a radiator having a heat pipe bent in an L-shape, a plurality of heat-radiation fins attached to a substantially horizontal portion of the heat pipe, and a heat receiving plate to which substantially vertical portions of a plurality of heat pipes are attached; a plurality of pieces of electronic equipment attached to the heat receiving plate; and a storage container for storing the plurality of pieces of electronic equipment (refer to, for example, PTL 2). Further, proposed is a thin heat sink that includes a plurality of thin plate-like bodies that includes a cavity portion for storing a centrifugal fan, is laminated at predetermined intervals, and includes an air guiding portion; at least one heat-radiation fin portion that is connected to an end of each thin plate-like body and through which air guided to the air guiding portion of the thin plate-like bodies passes; and at least one heat pipe one end of which is thermally connected to portions of the thin plate-like bodies thermally connected to a heating component, the other end of which is thermally connected to the heat-radiation fin portion, and at least a part of which is arranged with a space portion between the thin plate-like bodies (refer to, for example, PTL 3).

CITATION LIST

Patent Literature

[PTL 1]
  Japanese Patent Laid-open No. 2008-021899
[PTL 2]
  Japanese Patent Laid-open No. 2012-059952
[PTL 3]
  Japanese Patent Laid-open No. 2009-239166

SUMMARY OF INVENTION

Technical Problem

However, in these techniques of the related art, there is a problem that the size of the semiconductor laser driving apparatus is increased by installation of the cooling fan, the heat sink, or the heat pipe.

The present technique has been developed in view of such a situation, and an object thereof is to obtain excellent heat radiation characteristics with a simple structure.

Solution to Problem

The present technique has been made in order to solve the above-described problem, and a first aspect thereof is to provide a semiconductor laser driving apparatus including a substrate incorporating a laser driver; a semiconductor laser mounted on one surface of the substrate; connection wiring that electrically connects the laser driver and the semiconductor laser to each other with a wiring inductance of 0.5 nanohenries or less; and side walls having a heat storage material therein while surrounding a region including the semiconductor laser on the one surface of the substrate, and electronic equipment including the semiconductor laser driving apparatus. This leads to an effect of promoting heat radiation of the semiconductor laser driving apparatus that electrically connects the laser driver and the semiconductor laser to each other with a wiring inductance of 0.5 nanohenries or less.

In addition, in the first aspect, the heat storage material may cause a phase change below the limit temperature at which the semiconductor laser driving apparatus is usable. Specifically, any of vanadium oxide, a paraffin-based heat storage material, and a PCM (Phase Change Materials) sheet may be used.

In addition, in the first aspect, a bonding wire may be formed at a connection terminal portion of the semiconductor laser for the substrate, and the side walls may cover a region including the bonding wire. This leads to an effect of forming the side walls for promoting heat radiation and protecting the bonding wire.

In addition, in the first aspect, it is desirable that the connection wiring have a length of 0.5 millimeters or less. In addition, it is more preferable that the connection wiring be 0.3 millimeters or less.

In addition, in the first aspect, the connection wiring may be provided via a connection via provided in the substrate. This leads to an effect of shortening the wiring length.

In addition, in the first aspect, the semiconductor laser may be arranged in such a manner that a part thereof overlaps an upper part of the laser driver. In this case, the semiconductor laser may be arranged in such a manner that a part corresponding to 50% or less of the area overlaps the upper part of the laser driver.

In addition, in the first aspect, a diffusion plate covering an upper part of a region surrounded by the side walls may further be provided. This leads to an effect of attaching the diffusion plate to the side walls for promoting heat radiation.

In addition, a second aspect of the present technique is to provide a manufacturing method of a semiconductor laser driving apparatus, including a step of forming a laser driver on an upper surface of a support plate; a step of forming a substrate incorporating the laser driver by forming connection wiring of the laser driver; a step of mounting a semiconductor laser on one surface of the substrate and forming connection wiring that electrically connects the laser driver and the semiconductor laser to each other via the connection wiring with a wiring inductance of 0.5 nanohenries or less; and a step of forming side walls having a heat storage material therein while surrounding a region including the semiconductor laser on the one surface of the substrate. This leads to an effect of manufacturing the semiconductor laser driving apparatus that electrically connects the laser driver and the semiconductor laser to each other with a wiring inductance of 0.5 nanohenries or less and promotes heat radiation.

BRIEF DESCRIPTION OF DRAWINGS

FIG. 3 depicts diagrams each illustrating the definition of an amount of overlap between a laser driver 200 and a semiconductor laser 300 according to the embodiment of the present technique.

FIG. 4 is a diagram for illustrating a numerical example of a wiring inductance with respect to a wiring length L and a wiring width W in the case where a wiring pattern is formed by an additive method.

FIG. 5 is a diagram for illustrating a numerical example of the wiring inductance with respect to the wiring length L and the wiring width W in the case where a wiring pattern is formed by a subtractive method.

FIG. 6 depicts first diagrams each illustrating an example of a process of processing a copper land and copper redistribution layer (RDL) in a manufacturing process of the laser driver 200 according to the embodiment of the present technique.

FIG. 9 depicts second diagrams each illustrating an example of the manufacturing process of the substrate 100 according to the embodiment of the present technique.

FIG. 11 depicts fourth diagrams each illustrating an example of the manufacturing process of the substrate 100 according to the embodiment of the present technique.

FIG. 12 depicts fifth diagrams each illustrating an example of the manufacturing process of the substrate 100 according to the embodiment of the present technique.

FIG. 19 is a diagram for illustrating an external configuration example of the electronic equipment 800 as an application example of the embodiments of the present technique.

DESCRIPTION OF EMBODIMENTS

Hereinafter, modes for carrying out the present technique (hereinafter, referred to as embodiments) will be described. The description will be given in the following order.
1. First embodiment (example in which side walls are filled with heat storage material)
2. Second embodiment (example in which side walls cover region including bonding wire)
3. Third embodiment (example of using MUF)
4. Fourth embodiment (example of using CUF)
5. Application example 1. First Embodiment

[Semiconductor Laser Driving Apparatus]

Figure 1:
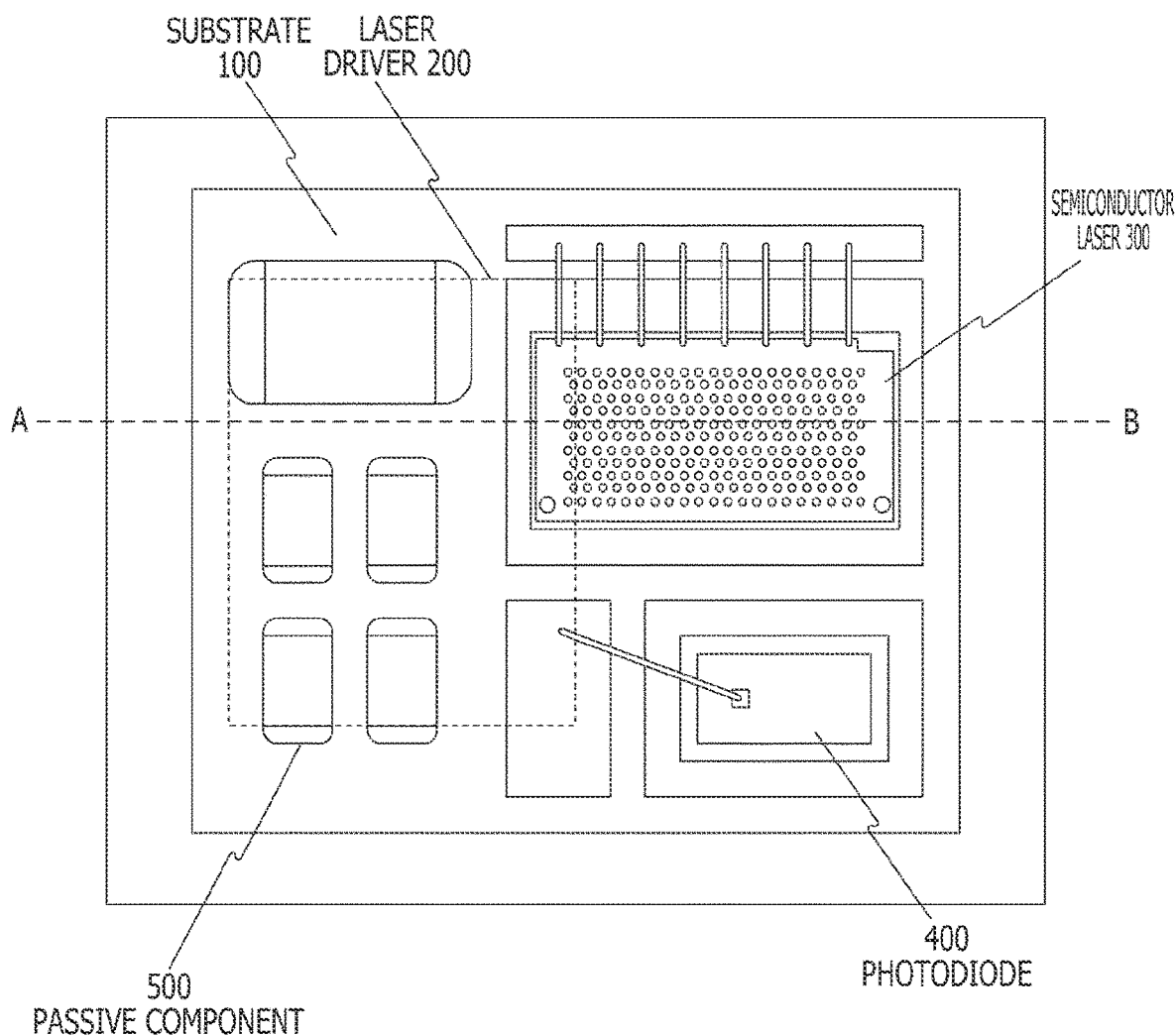
FIG. 1 is a diagram for illustrating an example of a top view of a semiconductor laser driving apparatus 10 according to an embodiment of the present technique.

FIG. 1 is a diagram for illustrating an example of a top view of a semiconductor laser driving apparatus 10 according to an embodiment of the present technique.

The semiconductor laser driving apparatus 10 assumes measurement of a distance by ToF. ToF is high in depth accuracy although not as high as the structured light, and has such a characteristic that it can operate in a dark environment without any problem. In addition, ToF is considered to have many advantages as compared with other systems such as the structured light and the stereo camera in terms of the simplicity of the apparatus configuration and cost.

In the semiconductor laser driving apparatus 10, a semiconductor laser 300, a photodiode 400, and a passive component 500 are electrically connected by wire bonding and mounted on the surface of a substrate 100 incorporating a laser driver 200. As the substrate 100, a printed wiring board is assumed.

The semiconductor laser 300 is a semiconductor device that emits laser light by allowing a current to flow through a PN junction of a compound semiconductor. Specifically, a vertical cavity surface emitting laser (VCSEL) is assumed. Here, as the compound semiconductor to be used, for example, aluminum gallium arsenide (AlGaAs), indium gallium arsenide phosphorus (InGaAsP), aluminum gallium indium phosphorus (AlGaInP), gallium nitride (GaN), and the like are assumed.

The laser driver 200 is a driver integrated circuit (IC) for driving the semiconductor laser 300. The laser driver 200 is incorporated in the substrate 100 in a face-up state. Regarding the electrical connection between the laser driver 200 and the semiconductor laser 300, since the wiring inductance needs to be reduced, it is desirable to make the wiring length as short as possible. This specific value will be described later.

The photodiode 400 is a diode for detecting light. The photodiode 400 is used for APC (Automatic Power Control) for maintaining the output of the semiconductor laser 300 constant by monitoring the light intensity of the semiconductor laser 300.

The passive component 500 is a circuit component other than active elements such as a capacitor and a resistor. The passive component 500 includes a decoupling capacitor for driving the semiconductor laser 300.

Figure 2:
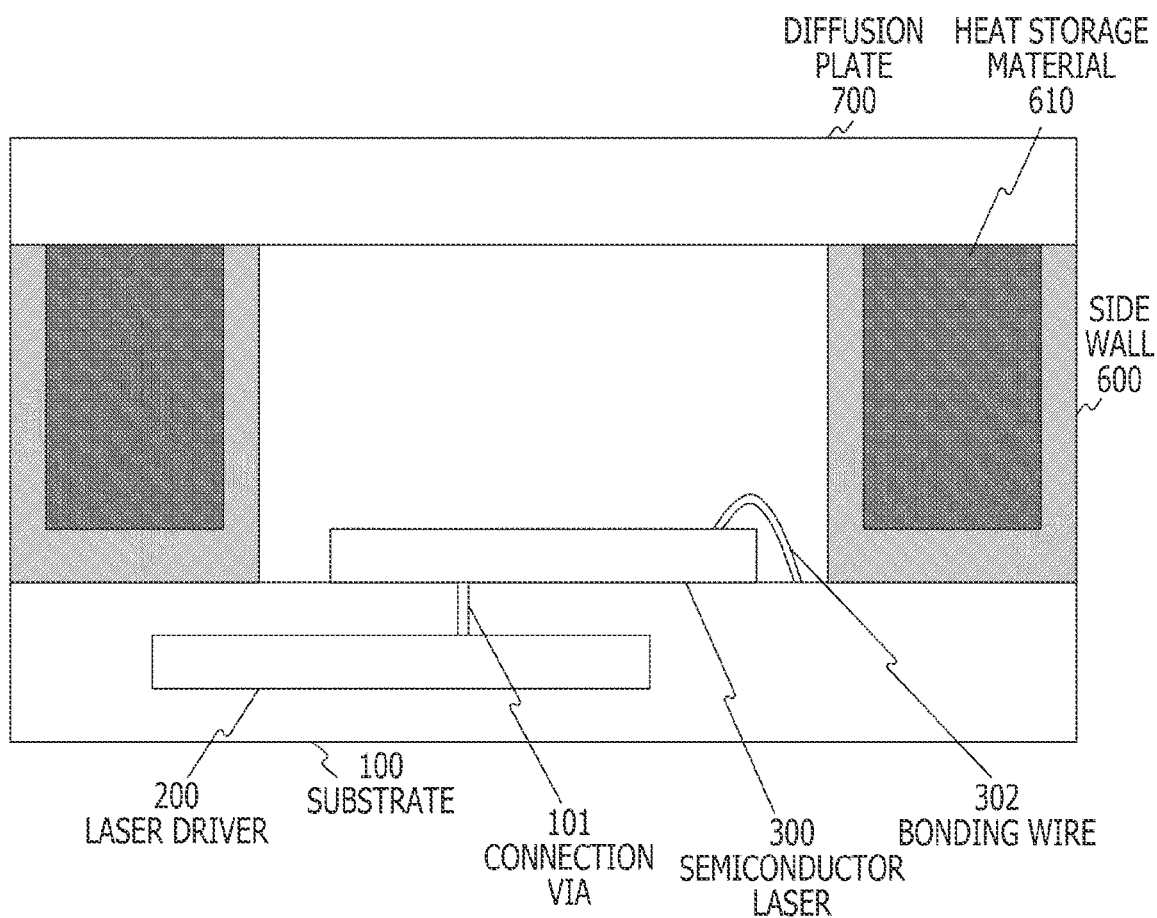
FIG. 2 is a diagram for illustrating an example of a cross-sectional view of the semiconductor laser driving apparatus 10 according to a first embodiment of the present technique.

FIG. 2 is a diagram for illustrating an example of a cross-sectional view of the semiconductor laser driving apparatus 10 according to the first embodiment of the present technique.

As described above, the substrate 100 incorporates the laser driver 200, and the semiconductor laser 300 and the like are mounted on the surface thereof. The connection between the semiconductor laser 300 and the laser driver 200 on the substrate 100 is made via a connection via 101. The wiring length can be shortened by use of the connection via 101. It should be noted that the connection via 101 is an example of the connection wiring described in the claims.

The semiconductor laser 300, the photodiode 400, and the passive component 500 mounted on the surface of the substrate 100 are surrounded by side walls 600. Each side wall 600 has a recessed portion, and each recessed portion is filled with a heat storage material 610. The heat storage material 610 causes a phase change below the limit temperature at which the semiconductor laser driving apparatus 10 can be used.

As the heat storage material 610, vanadium oxide, a paraffin-based heat storage material, a PCM (Phase Change Material) sheet, or the like is assumed. The thermal conductivities of these materials are, for example, 10 to 250 watts per meter Kelvin (W/m·K). In addition, the latent heat is, for example, 50 to 510 joules per gram (J/g). The heat storage material such as vanadium oxide is used for air conditioning of houses, heat and cold insulation during transportation, and the like.

Vanadium oxide is solid at room temperature, is relatively easy to handle as powder, and has high latent heat as compared with a paraffin-based heat storage material. On the other hand, vanadium oxide has high density as compared with the paraffin-based heat storage material. In addition, the paraffin-based heat storage material becomes a gel state from a solid state at a temperature of 80° C. or higher, but can easily be handled when contained in a microcapsule. It should be noted that what is obtained by having a paraffin-based heat storage material contained in a microcapsule is also called a thermo-memory.

The upper surface surrounded by the side walls 600 is covered with a diffusion plate 700. The diffusion plate 700 is an optical element for diffusing the laser light from the semiconductor laser 300, and is also called a diffuser.

FIG. 3 depicts diagrams each illustrating the definition of an amount of overlap between the laser driver 200 and the semiconductor laser 300 according to the embodiment of the present technique.

As described above, since the connection between the semiconductor laser 300 and the laser driver 200 is assumed to be made via the connection via 101, the semiconductor laser 300 and the laser driver 200 are arranged while being overlapped one on another when viewed from the upper surface. On the other hand, it is desirable to provide a thermal via on the lower surface of the semiconductor laser 300, and it is also necessary to secure a region therefor. Accordingly, in order to clarify the positional relation between the laser driver 200 and the semiconductor laser 300, the amount of overlap between the two is defined as follows.

In the arrangement illustrated in a of FIG. 3, there is no overlap region between the two when viewed from the upper surface. The overlap amount in this case is defined as 0%. On the other hand, in the arrangement illustrated in c of FIG. 3, the entire semiconductor laser 300 overlaps the laser driver 200 when viewed from the upper surface. The overlap amount in this case is defined as 100%.

Then, in the arrangement illustrated in b of FIG. 3, the half region of the semiconductor laser 300 overlaps the laser driver 200 when viewed from the upper surface. The overlap amount in this case is defined as 50%.

In the embodiment, the overlap amount is desirably larger than 0% to provide a region for the above-described connection via 101. On the other hand, when considering that a certain number of thermal vias are to be arranged directly under the semiconductor laser 300, the overlap amount is desirably 50% or less. Thus, by making the overlap amount larger than 0% but 50% or less, the wiring inductance is reduced, and excellent heat radiation characteristics can be obtained.

[Wiring Inductance]

As described above, the wiring inductance becomes a problem in the connection between the semiconductor laser 300 and the laser driver 200. All conductors have an inductive component, and even an inductance of an extremely short lead wire may cause adverse effects in high frequency regions such as a ToF system. That is, when a high frequency operation is performed, the driving waveform for driving the semiconductor laser 300 from the laser driver 200 is distorted due to the influence of the wiring inductance, and the operation may become unstable.

Here, a theoretical equation for calculating the wiring inductance is examined. For example, the inductance IDC [pH] of a straight lead wire having a circular cross section with a length L [mm] and a radius R [mm] is represented in free space by the following equation. Note that ln represents the natural logarithm.

$$IDC=0.0002L \cdot (\ln(2L/R)-0.75)$$

In addition, for example, the inductance IDC [μH] of a strip line (substrate wiring pattern) having a length L [mm], a width W [mm], and a thickness H [mm] is represented in free space by the following equation.

$$IDC=0.0002L \cdot (\ln(2L/(W+H))+0.2235((W+H)/L)+0.5)$$

FIG. 4 and FIG. 5 illustrate the preliminary calculation of the wiring inductance [nH] between the laser driver incorporated inside the printed wiring board and the semiconductor laser electrically connected to an upper portion of the printed wiring board.

FIG. 4 is a diagram for illustrating a numerical example of a wiring inductance with respect to a wiring length L and a wiring width W in the case where a wiring pattern is formed by an additive method. The additive method is a method of forming a pattern by depositing copper only on a necessary part of an insulating resin surface.

FIG. 5 is a diagram for illustrating a numerical example of the wiring inductance with respect to the wiring length L and the wiring width W in the case where a wiring pattern is formed by a subtractive method. The subtractive is a method of forming a pattern by etching an unnecessary part of a copper-clad laminate.

In the case of a semiconductor laser driving apparatus such as a ToF system, when assuming to drive at several hundred megahertz, the wiring inductance is desirably 0.5 nH or less, and more preferably 0.3 nH or less. Thus, when considering the above-described preliminary calculation result, it is considered that the wiring length between the semiconductor laser 300 and the laser driver 200 is desirably 0.5 millimeters or less, and more preferably 0.3 millimeters or less.

[Manufacturing Method]

Figure 7:
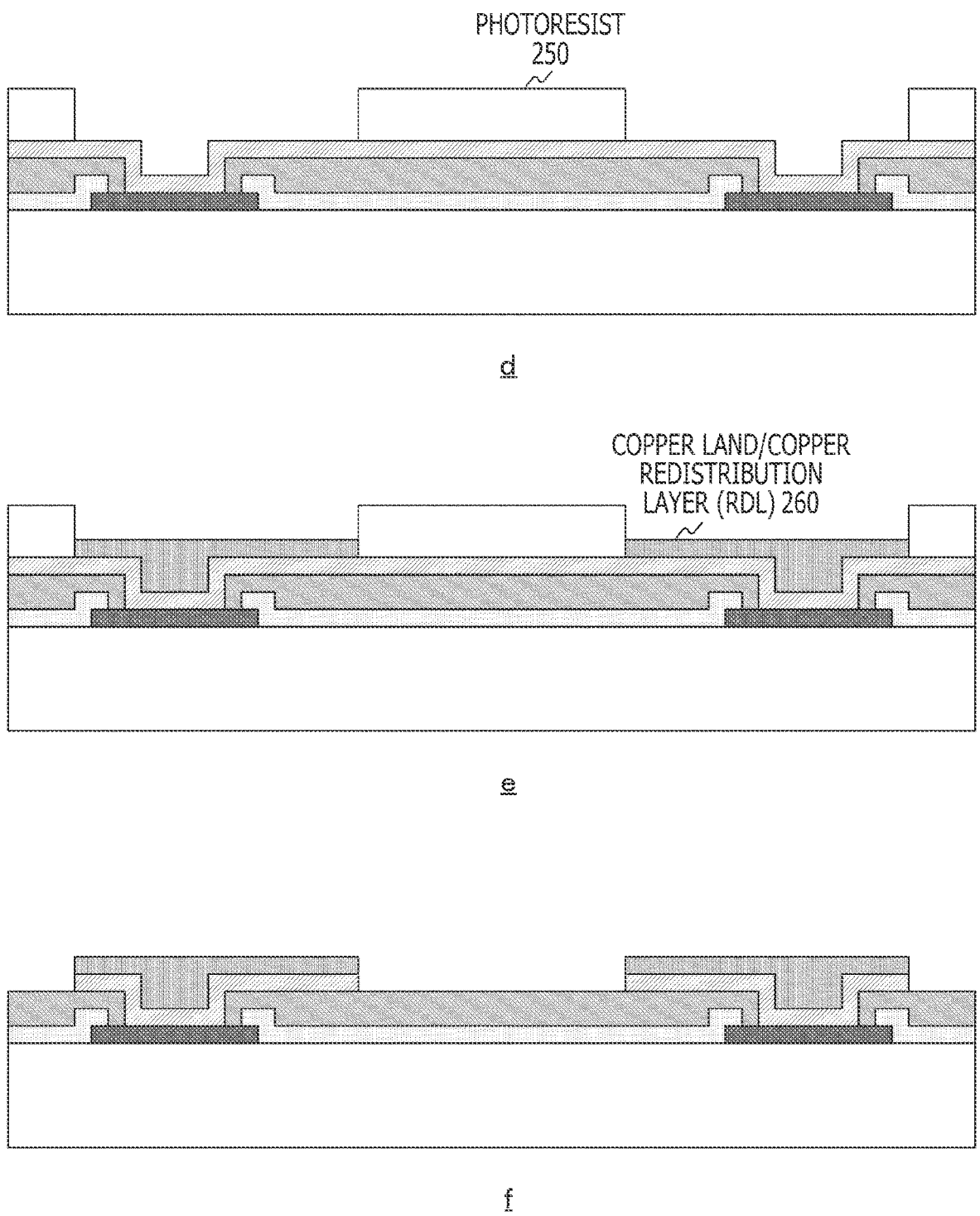
FIG. 7 depicts second diagrams each illustrating an example of a process of processing the copper land and copper redistribution layer (RDL) in the manufacturing process of the laser driver 200 according to the embodiment of the present technique.

FIG. 6 and FIG. 7 are diagrams each illustrating an example of a process of processing a copper land and copper redistribution layer (RDL) in a manufacturing process of the laser driver 200 of the embodiment of the present technique.

First, as illustrated in a of FIG. 6, an I/O pad 210 made of, for example, aluminum or the like is formed on a semiconductor wafer. Then, a protective insulating layer 220 such as SiN is deposited on the surface, and a region of the I/O pad 210 is opened.

Next, as illustrated in b of FIG. 6, a surface protective film 230 made of polyimide (PI) or polybenzoxazole (PBO) is deposited, and a region of the I/O pad 210 is opened.

Then, as illustrated in c of FIG. 6, titanium tungsten (TiW) of approximately several tens to hundreds nm and copper (Cu) of approximately 100 to 1000 nm are sequentially sputtered to form an adhesion layer and seed layer 240. Here, in addition to titanium tungsten (TiW), a refractory metal such as chromium (Cr), nickel (Ni), titanium (Ti), titanium copper (TiCu), or platinum (Pt), or an alloy thereof may be applied to the adhesion layer. Further, in addition to copper (Cu), nickel (Ni), silver (Ag), gold (Au), or an alloy thereof may be applied to the seed layer.

Subsequently, as illustrated in d of FIG. 7, a photoresist 250 is patterned in order to form a copper land and copper redistribution layer for electrical bonding. Specifically, the copper land and copper redistribution layer for electrical bonding is formed by each of processes of surface cleaning, resist coating, drying, exposure, and development.

Then, as illustrated in e of FIG. 7, a copper land and copper redistribution layer (RDL) 260 for electrical bonding is formed on the adhesion layer and seed layer 240 by a plating method. Here, as the plating method, for example, an electrolytic copper plating method, an electrolytic nickel plating method, or the like can be used. In addition, it is desirable that the diameter of the copper land be approximately 50 to 100 micrometers, the thickness of the copper redistribution layer be approximately 3 to 10 micrometers, and the minimum width of the copper redistribution layer be approximately 10 micrometers.

Next, as illustrated in f of FIG. 7, the photoresist 250 is removed, and the copper land and copper redistribution layer (RDL) 260 of the semiconductor chip is masked and dry-etched. Here, as the dry etching, for example, ion milling for applying an argon ion beam can be used. An unnecessary region of the adhesion layer and seed layer 240 can be selectively removed by the dry etching, and the copper land and copper redistribution layers are separated from each other. It should be noted that the unnecessary region can be removed by wet etching using an aqueous solution of aqua regia, cerium (IV) nitrate ammonium, or potassium hydroxide, but is desirably removed by dry etching in consideration of side etching and thickness reduction of metal layers configuring the copper land and copper redistribution layer.

FIG. 8 to FIG. 12 are diagrams each illustrating an example of a manufacturing process of the substrate 100 according to the embodiment of the present technique.

Figure 8:
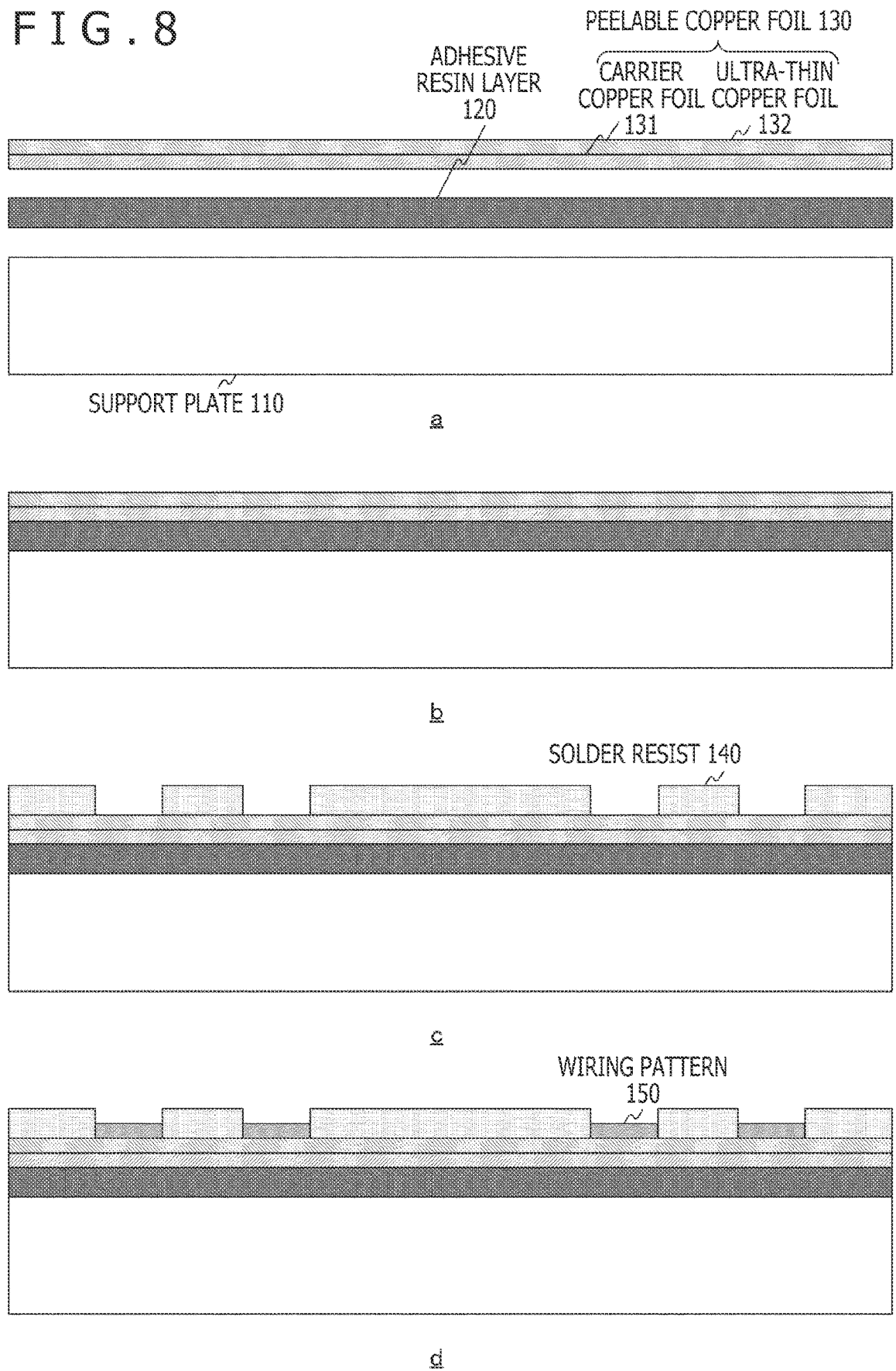
FIG. 8 depicts first diagrams each illustrating an example of a manufacturing process of a substrate 100 in the embodiment of the present technique.

First, as illustrated in a of FIG. 8, a peelable copper foil 130 having a two-layer structure of an ultra-thin copper foil 132 and a carrier copper foil 131 is thermocompression bonded to one surface of a support plate 110 via an adhesive resin layer 120 by roll laminating or laminating press.

As the support plate 110, a substrate made of an inorganic material, a metal material, a resin material, or the like can be used. For example, silicon (Si), glass, ceramic, copper, a copper-based alloy, aluminum, an aluminum alloy, stainless steel, a polyimide resin, or an epoxy resin can be used.

The carrier copper foil 131 having a thickness of 18 to 35 micrometers is vacuum-adhered to the ultra-thin copper foil 132 having a thickness of 2 to 5 micrometers, to be used as the peelable copper foil 130. As the peelable copper foil 130, for example, 3FD-P3/35 (made by Furukawa Circuit Foil Co., Ltd.), MT-18S5DH (made by MITSUI MINING & SMELTING CO., LTD.), or the like can be used.

As a resin material of the adhesive resin layer 120, an organic resin containing a reinforcing material of a glass fiber, such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, as the reinforcing material, an aramid nonwoven fabric, an aramid fiber, a polyester fiber, or the like can be used in addition to the glass fiber.

Next, as illustrated in b of FIG. 8, a plating base conductive layer (not illustrated) having a thickness of 0.5 to 3 micrometers is formed on the surface of the ultra-thin copper foil 132 of the peelable copper foil 130 by an electroless copper plating treatment. It should be noted that, in the electroless copper plating treatment, a conductive layer is formed as a base of electrolytic copper plating for forming a wiring pattern next. However, by omitting the electroless copper plating treatment, an electrode for electrolytic copper plating may be brought into direct contact with the peelable copper foil 130, and an electrolytic copper plating treatment may be directly applied on the peelable copper foil 130 to form a wiring pattern.

Then, as illustrated in c of FIG. 8, a photosensitive resist is pasted on the surface of the support plate by roll laminating, to form a resist pattern (solder resist 140) for a wiring pattern. As the photosensitive resist, for example, a plating resist of a dry film can be used.

Subsequently, as illustrated in d of FIG. 8, a wiring pattern 150 having a thickness of approximately 15 micrometers is formed by an electrolytic copper plating treatment.

Then, as illustrated in e of FIG. 9, the plating resist is peeled off. Then, as a pretreatment for forming an interlayer insulating resin, the surface of the wiring pattern is roughened to improve the adhesion between the interlayer insulating resin and the wiring pattern. It should be noted that the roughening treatment can be performed by a blackening treatment by an oxidation/reduction treatment or a soft etching treatment using a sulfuric acid hydrogen peroxide mixture.

Next, as illustrated in f of FIG. 9, an interlayer insulating resin 161 is thermocompression bonded on the wiring pattern by roll laminating or laminating press. For example, an epoxy resin having a thickness of 45 micrometers is roll-laminated. In the case where a glass epoxy resin is used, copper foils having any thickness are superposed and thermocompression bonded by laminating press. As a resin material of the interlayer insulating resin 161, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, these resins alone or a combination of resins obtained by mixing a plurality of resins or preparing a compound can be used. Further, an interlayer insulating resin obtained by containing an inorganic filler in these materials or mixing a reinforcing material of a glass fiber can also be used.

Then, as illustrated in g of FIG. 9, a via hole for interlayer electrical connection is formed by a laser method or a photoetching method. In the case where the interlayer insulating resin 161 is a thermosetting resin, the via hole is formed by a laser method. As a laser beam, an ultraviolet laser such as a harmonic YAG laser or an excimer laser or an infrared laser such as a carbon dioxide gas laser can be used. It should be noted that, in the case where the via hole is formed by a laser beam, a desmear treatment is performed because a thin resin film may remain at the bottom of the via hole. In the desmear treatment, the resin is swollen by a strong alkali, and the resin is decomposed and removed by using an oxidizing agent such as chromic acid or a permanganate aqueous solution. In addition, the resin can also be removed by a plasma treatment or a sandblasting treatment by an abrasive material. In the case where the interlayer insulating resin 161 is a photosensitive resin, the via hole 170 is formed by a photoetching method. That is, the via hole 170 is formed by development after exposure using ultraviolet rays through a mask.

Next, after the roughening treatment, an electroless plating treatment is performed on the wall surface of the via hole 170 and the surface of the interlayer insulating resin 161. Then, a photosensitive resist is pasted by roll laminating on the surface of the interlayer insulating resin 161 subjected to the electroless plating treatment. As the photosensitive resist in this case, for example, a photosensitive plating resist film of a dry film can be used. The photosensitive plating resist film is exposed and then developed, so that a plating resist pattern with the portion of the via hole 170 and the portion of the wiring pattern being opened is formed. Subsequently, the opening portions of the plating resist pattern are subjected to a treatment of applying an electrolytic copper plating having a thickness of 15 micrometers. Then, the plating resist is peeled off, and the electroless plating remaining on the interlayer insulating resin is removed by flash etching using a sulfuric acid hydrogen peroxide mixture or the like, so that the via hole 170 filled with copper plating and the wiring pattern as illustrated in h of FIG. 9 are formed. Then, the similar steps of roughening the wiring pattern and forming the interlayer insulating resin 162 are repeated.

Subsequently, as illustrated in i of FIG. 10, the laser driver 200 with a die attach film (DAF) 290 obtained by processing the copper land and copper redistribution layer with a thickness reduced to approximately 30 to 50 micrometers is mounted in a face-up state.

Figure 10:
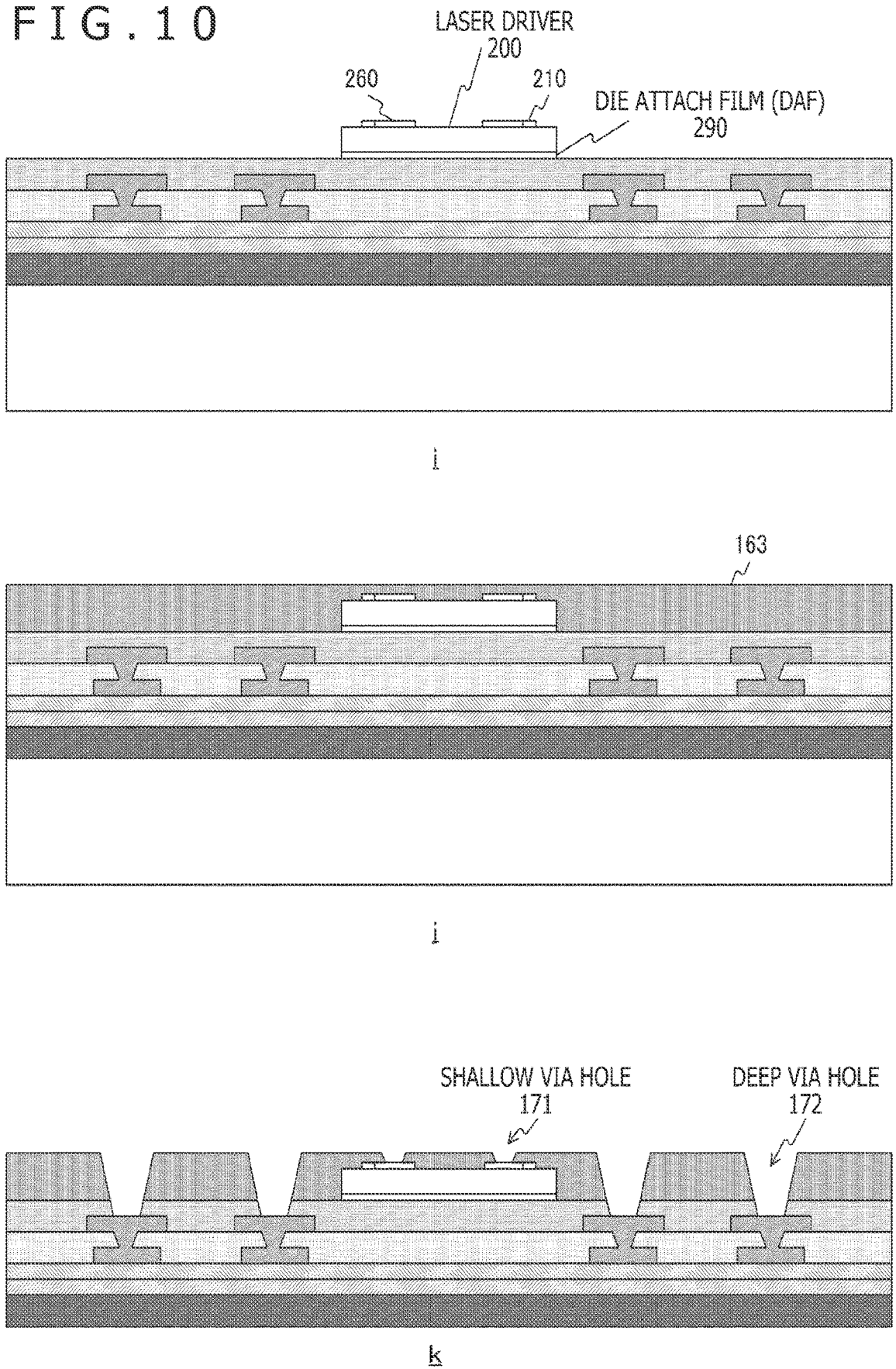
FIG. 10 depicts third diagrams each illustrating an example of the manufacturing process of the substrate 100 according to the embodiment of the present technique.

Then, as illustrated in j of FIG. 10, the interlayer insulating resin 163 is thermocompression bonded by roll laminating or laminating press.

Next, as illustrated in k of FIG. 10 and l of FIG. 11, the via hole processing, the desmear treatment, the roughening treatment, the electroless plating treatment, and the electrolytic plating treatment similar to the above are performed. It should be noted that processing of a shallow via hole 171 for the copper land of the laser driver 200 and processing of a deep via hole 172 located one layer below, the desmear treatment, and the roughening treatment are performed simultaneously.

Here, the shallow via hole 171 is a filled via filled with copper plating. Each of the size and depth of the via is approximately 20 to 30 micrometers. In addition, the size of the diameter of the land is approximately 60 to 80 micrometers.

On the other hand, the deep via hole 172 is what is generally called a conformal via in which copper plating is applied only to the outside of the via. Each of the size and depth of the via is approximately 80 to 150 micrometers. In addition, the size of the diameter of the land is approximately 150 to 200 micrometers. It should be noted that it is desirable that the deep via hole 172 be arranged via an insulating resin of approximately 100 micrometers from the outer shape of the laser driver 200.

Next, as illustrated in m of FIG. 11, the interlayer insulating resin similar to the above is thermocompression bonded by roll laminating or laminating press. At this time, the inside of the conformal via is filled with the interlayer insulating resin. Then, the via hole processing, the desmear treatment, the roughening treatment, the electroless plating treatment, and the electrolytic plating treatment similar to the above are performed.

Subsequently, as illustrated in n of FIG. 11, the support plate 110 is separated by being peeled off from the interface between the carrier copper foil 131 and the ultra-thin copper foil 132 of the peelable copper foil 130.

Then, as illustrated in o of FIG. 12, by removing the ultra-thin copper foil 132 and the plating base conductive layer with use of sulfuric acid-hydrogen peroxide-based soft etching, it is possible to obtain a component-incorporated substrate with the wiring pattern exposed.

Next, as illustrated in p of FIG. 12, a solder resist 180 of a pattern having an opening at the land portion of the wiring pattern is printed on the exposed wiring pattern. It should be noted that the solder resist 180 can be formed by a roll coater with use of a film type. Then, an electroless Ni plating of 3 micrometers or more is formed at the land portion of the opening of the solder resist 180, and an electroless Au plating of 0.03 micrometers or more is formed thereon. The electroless Au plating may be formed by one micrometer or more. Further, solder can be precoated thereon. Alternatively, an electrolytic Ni plating of 3 micrometers or more may be formed at the opening of the solder resist 180, and an electrolytic Au plating of 0.5 micrometers or more may be formed thereon. Further, other than the metal plating, an organic rust preventive film may be formed at the opening of the solder resist 180.

In addition, a BGA (Ball Grid Array) of solder balls may be mounted on the land for external connection by printing and applying cream solder as a connection terminal. In addition, as the connection terminal, a copper core ball, a copper pillar bump, a land grid array (LGA), or the like may be used.

The semiconductor laser 300, the photodiode 400, and the passive component 500 are mounted on the surface of the substrate 100 thus manufactured as described above, and the side walls 600 and the diffusion plate 700 are attached thereto. In general, after performing the processing in the form of an aggregate substrate, the outer shape is processed by a dicer or the like to be separated into individual pieces.

It should be noted that, although the example of using the peelable copper foil 130 and the support plate 110 has been described in the above process, a copper clad laminate (CCL) can be used instead. In addition, as the manufacturing method of incorporating the component into the substrate, a method of forming a cavity in the substrate and mounting the same may be used.

Figure 13:
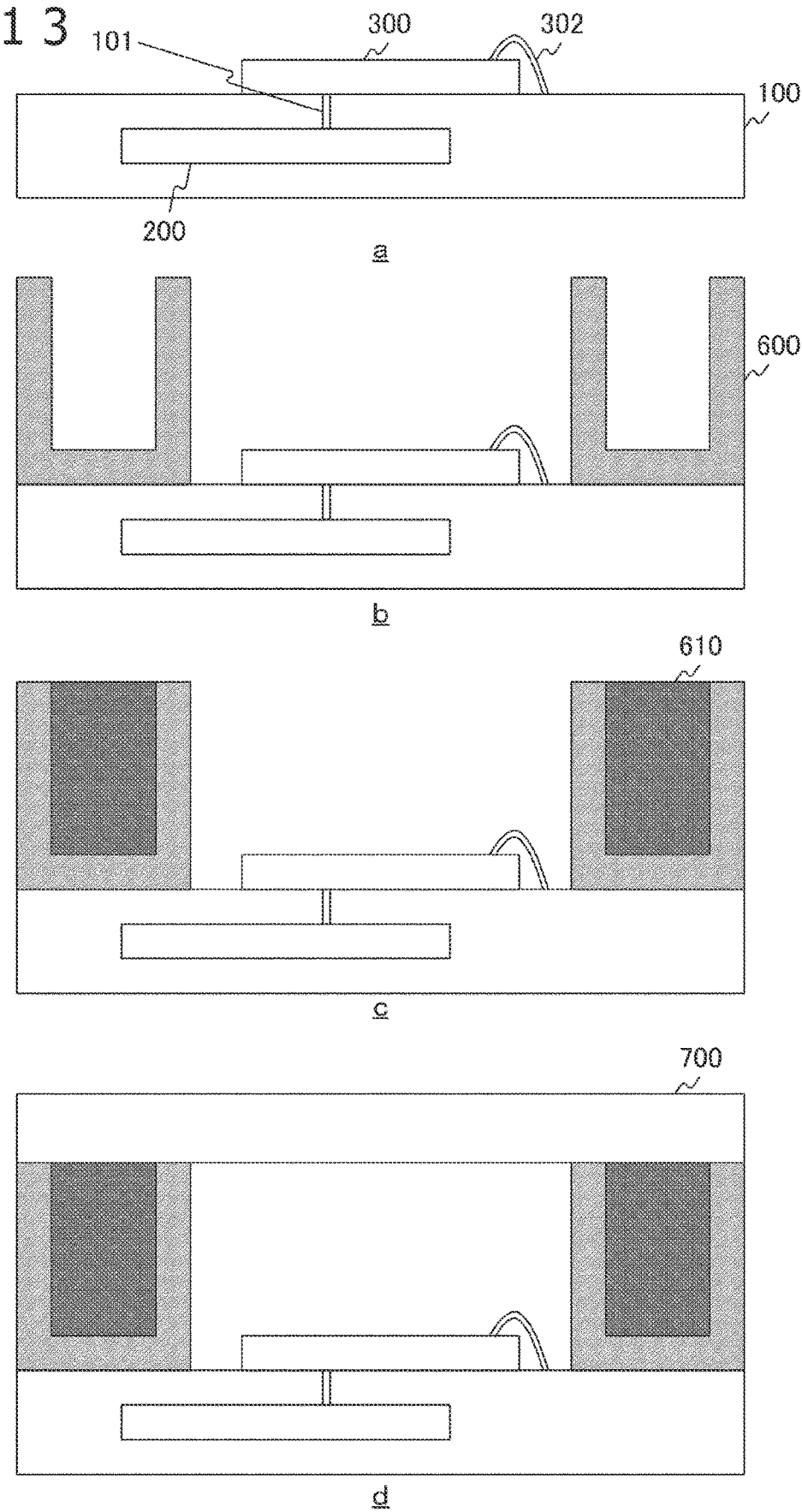
FIG. 13 depicts diagrams each illustrating an example of a manufacturing process of the semiconductor laser driving apparatus 10 according to the first embodiment of the present technique.

FIG. 13 depicts diagrams each illustrating an example of a manufacturing process of the semiconductor laser driving apparatus 10 according to the first embodiment of the present technique.

As illustrated in a of FIG. 13, the semiconductor laser 300 is die-attached on the substrate 100 incorporating the laser driver 200 by conductive paste, and a bonding wire 302 is formed. Accordingly, the semiconductor laser 300 and the wiring of the substrate 100 are electrically connected to each other.

Next, as illustrated in b of FIG. 13, the side walls 600 are formed around the region where the semiconductor laser 300 is mounted. Each side wall 600 has a recessed portion. The side walls 600 may be formed by die molding using a thermosetting resin as a material, may be formed by cutting processing, or may be formed by sheet metal processing of metal.

Next, as illustrated in c of FIG. 13, the recessed portions of the side walls 600 are filled with the heat storage material 610. As a filling method of the heat storage material 610, for example, an insert molding method in which the heat storage material 610 is injected into the recessed portions of the side walls 600, a coating method in which the heat storage material 610 is applied, and the like are assumed.

Finally, as illustrated in d of FIG. 13, the diffusion plate 700 is attached.

By such a process, the semiconductor laser driving apparatus 10 having the heat storage material 610 in the recessed portions of the side walls 600 is formed.

As described above, according to the first embodiment of the present technique, the electrical connection between the semiconductor laser 300 and the laser driver 200 is made via the connection via 101, so that the wiring inductance can be reduced. Specifically, the wiring inductance can be reduced to 0.5 nanohenries or less by making the wiring length between them 0.5 millimeters or less. In addition, by making the amount of overlap between the semiconductor laser 300 and the laser driver 200 50% or less, a certain number of thermal vias can be arranged directly under the semiconductor laser 300, and excellent heat radiation characteristics can be obtained.

In addition, in the first embodiment, it is possible to realize highly efficient heat transfer although the structure is simple. According to this structure, since the heat storage material 610 temporarily stores the heat generated in the semiconductor laser 300 and the laser driver 200, it is possible to prevent the temperature of the entire semiconductor laser driving apparatus 10 from rising. In this case, the heat generated is radiated from the heat storage material 610 to the mother board and the atmosphere under the condition that the heat generation from each component is small. Accordingly, the temperature rise of the heat source of the semiconductor laser driving apparatus 10 is suppressed, and high-quality laser emission characteristics can be obtained.

2. Second Embodiment

In the above-described first embodiment, the side walls 600 are formed so as not to cover the bonding wire 302. In contrast, in the second embodiment, an example in which the side walls 600 are formed so as to cover the bonding wire 302 will be described. It should be noted that, since the substrate 100 itself incorporating the laser driver 200 is similar to that of the above-described first embodiment, the detailed description thereof will be omitted.

[Semiconductor Laser Driving Apparatus]

Figure 14:
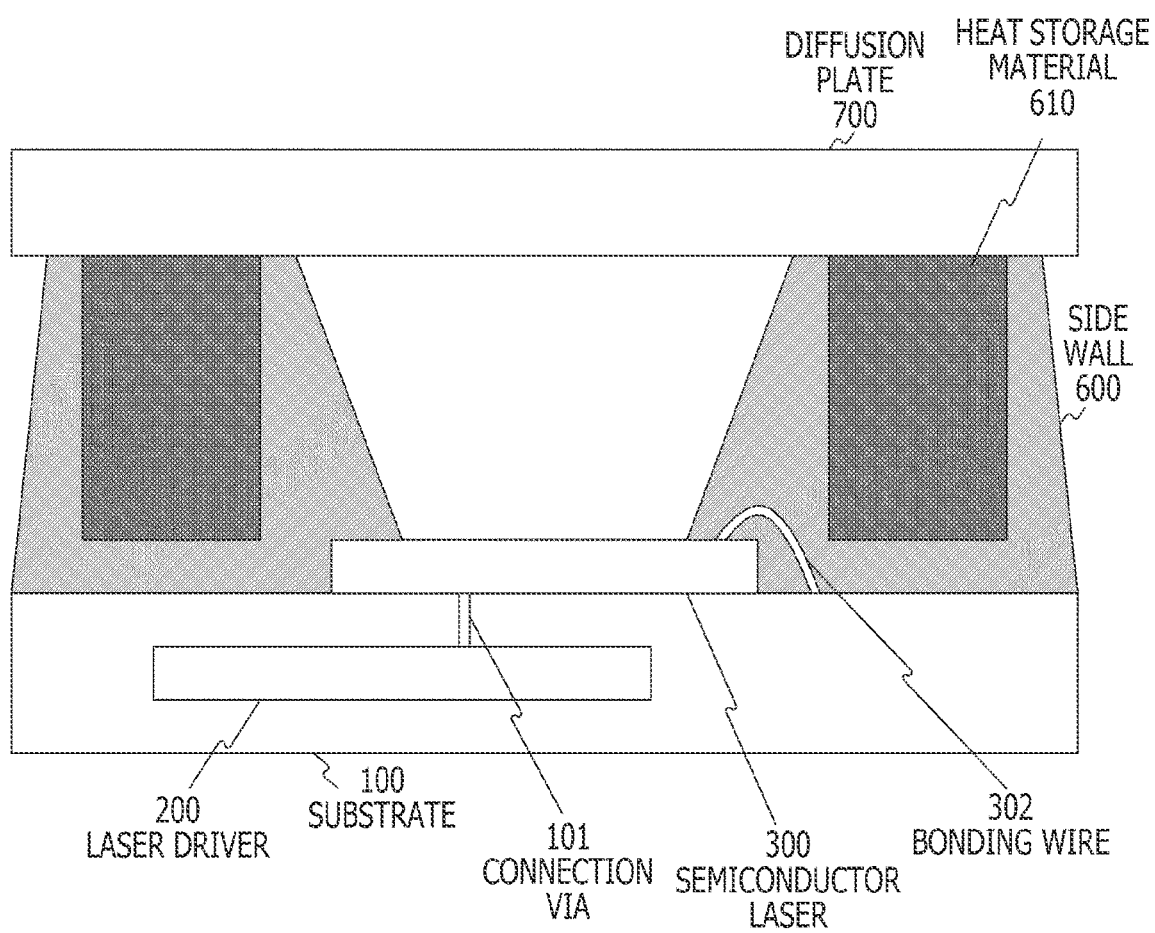
FIG. 14 is a diagram for illustrating an example of a cross-sectional view of a semiconductor laser driving apparatus 10 according to a second embodiment of the present technique.

FIG. 14 is a diagram for illustrating an example of a cross-sectional view of a semiconductor laser driving apparatus 10 according to a second embodiment of the present technique.

In the second embodiment, the side walls 600 are formed so as to cover the bonding wire 302 of the semiconductor laser 300 mounted on the substrate 100 and the periphery of the semiconductor laser 300. The side walls 600 have the recessed portions as in the first embodiment, and the recessed portions are filled with the heat storage material 610. The properties of the heat storage material 610 are similar to those in the above-described first embodiment.

The upper surface surrounded by the side walls 600 is covered with the diffusion plate 700 as in the above-described first embodiment.

[Manufacturing Method]

Figure 15:
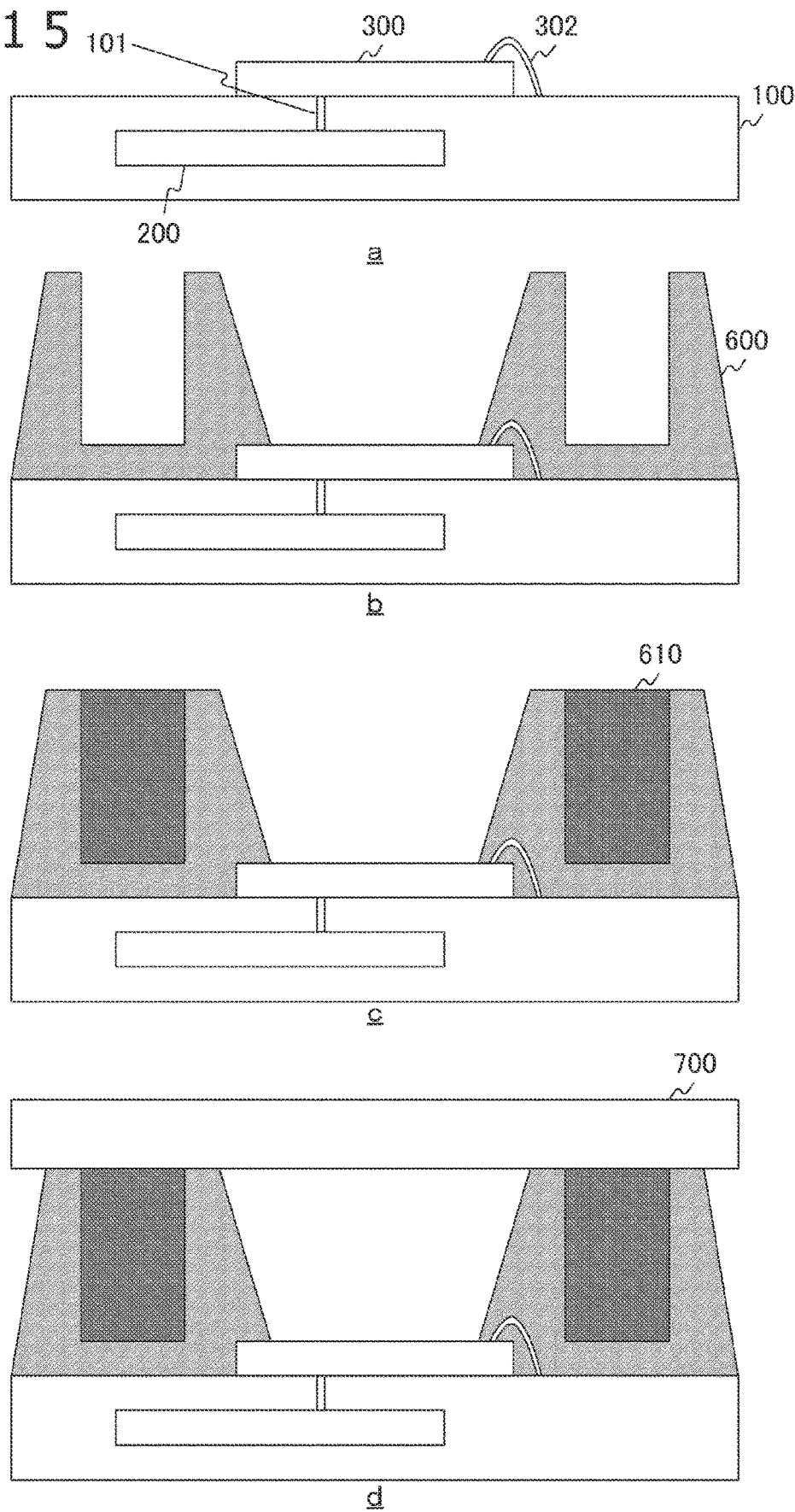
FIG. 15 depicts diagrams each illustrating an example of a manufacturing process of the semiconductor laser driving apparatus 10 according to the second embodiment of the present technique.

FIG. 15 depicts diagrams each illustrating an example of a manufacturing process of the semiconductor laser driving apparatus 10 according to the second embodiment of the present technique.

As illustrated in a of FIG. 15, the semiconductor laser 300 is die-attached on the substrate 100 incorporating the laser driver 200 by conductive paste, and the bonding wire 302 is formed. Accordingly, the semiconductor laser 300 and the wiring of the substrate 100 are electrically connected to each other.

Next, as illustrated in b of FIG. 15, the side walls 600 are formed around the region where the semiconductor laser 300 is mounted. In the second embodiment, the side walls 600 are formed so as to cover the bonding wire 302 of the semiconductor laser 300 and the periphery of the semiconductor laser 300. Accordingly, peeling off of the bonding wire 302 due to moisture, corrosive gas, or the like or vibration impact can be suppressed.

The side walls 600 have the recessed portions as in the above-described first embodiment. The side walls 600 may be formed by die molding using a thermosetting resin as a material, may be formed by cutting processing, or may be formed by sheet metal processing of metal.

Next, as illustrated in c of FIG. 15, the recessed portions of the side walls 600 are filled with the heat storage material 610. As a filling method of the heat storage material 610, for example, an insert molding method, a coating method, and the like are assumed.

Finally, as illustrated in d of FIG. 15, the diffusion plate 700 is attached.

By such a process, the recessed portions are filled with the heat storage material 610 to form the semiconductor laser driving apparatus 10 having the side walls 600 covering the bonding wire 302 and the periphery of the semiconductor laser 300.

As described above, according to the second embodiment of the present technique, it is possible to perform highly efficient heat radiation with a simple structure and to protect the bonding wire 302 in the semiconductor laser driving apparatus 10 in which the wiring inductance is reduced.

3. Third Embodiment

In the above-described first embodiment, it is assumed to have the heat storage material 610 in the recessed portions of the side walls 600, but an MUF (Mold UnderFill) is assumed to be used in the third embodiment, and the heat storage material 610 is provided in recessed portions of the MUF.

[Semiconductor Laser Driving Apparatus]

Figure 16:
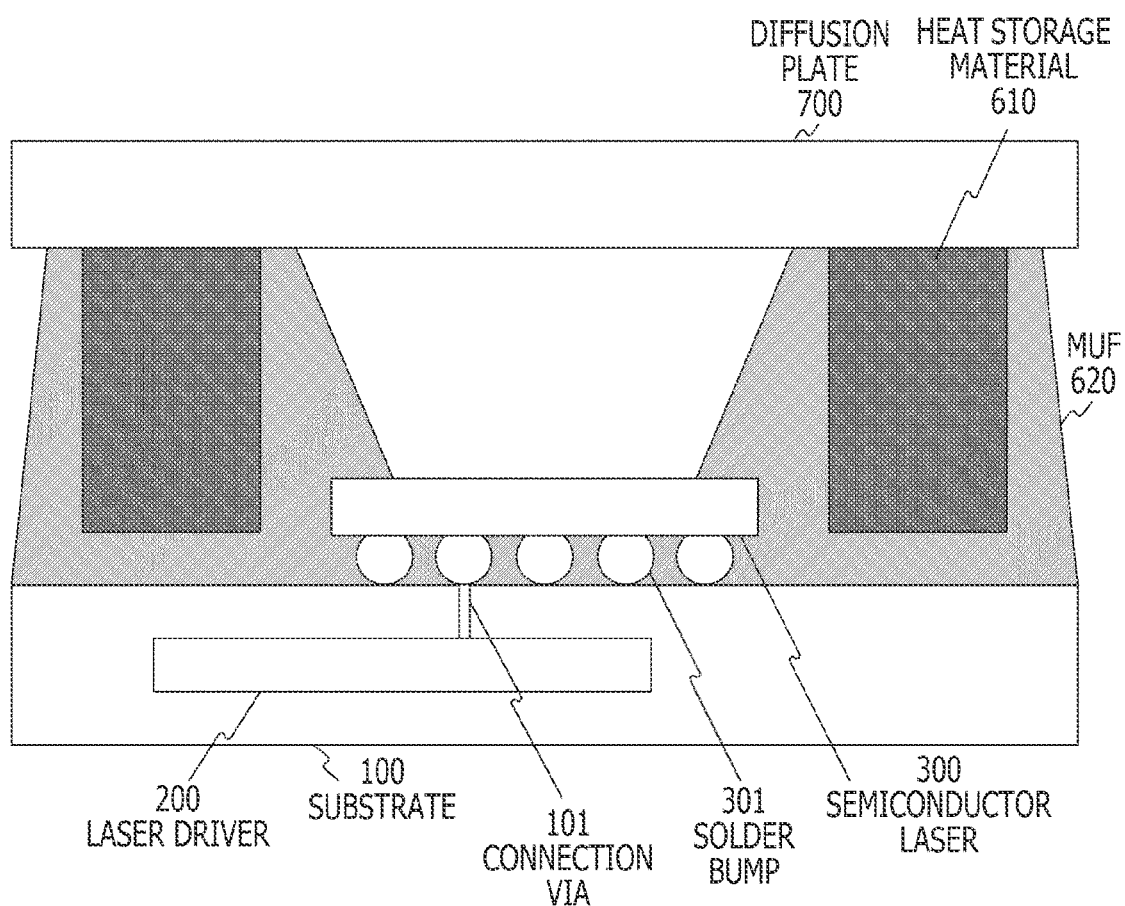
FIG. 16 is a diagram for illustrating an example of a cross-sectional view of a semiconductor laser driving apparatus 10 according to a third embodiment of the present technique.

FIG. 16 is a diagram for illustrating an example of a cross-sectional view of a semiconductor laser driving apparatus 10 according to the third embodiment of the present technique.

In the third embodiment, the semiconductor laser 300 is flip-chip mounted on the substrate 100. Thus, solder bumps 301 are formed at a connection terminal portion of the semiconductor laser 300. However, other materials such as a copper (Cu) pillar bump and a gold (Au) bump may be used as the connection terminal portion.

In order to ensure connection reliability, it is necessary to fill the connection terminal portion of the semiconductor laser 300 with an underfill. In the third embodiment, an MUF 620 is used. The MUF 620 is an example of the sealing portion described in the claims.

In addition, the semiconductor laser 300, the photodiode 400, and the passive component 500 mounted on the surface of the substrate 100 are surrounded by the MUF 620. Thus, the underfill of the connection terminal portion of the semiconductor laser 300 is formed by the MUF 620, and side wall portions are simultaneously formed. As a material of the MUF 620, for example, a thermosetting resin is assumed.

The MUF 620 has recessed portions, and the recessed portions are filled with the heat storage material 610 as in the above-described embodiments. Accordingly, since the heat storage material 610 temporarily stores the heat generated in the semiconductor laser 300 and the laser driver 200, it is possible to prevent the temperature of the entire semiconductor laser driving apparatus 10 from rising.

As described above, according to the third embodiment of the present technique, it is possible to prevent the temperature of the entire semiconductor laser driving apparatus 10 from rising by filling the MUF 620 with the heat storage material 610.

4. Fourth Embodiment

In the above-described third embodiment, it is assumed to use the MUF for sealing the underfill of the connection terminal portion, but a CUF (Capillary UnderFill) is assumed to be used in a fourth embodiment.

[Semiconductor Laser Driving Apparatus]

Figure 17:
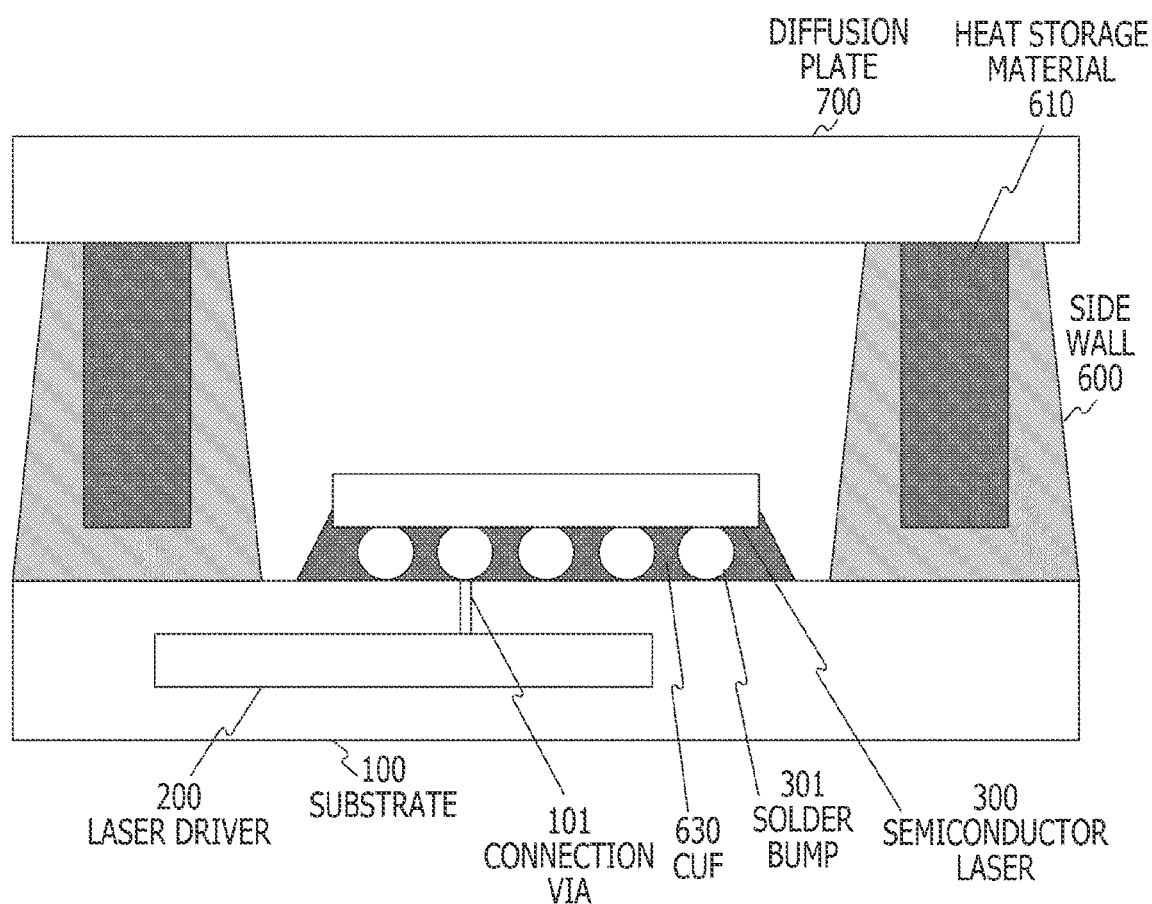
FIG. 17 is a diagram for illustrating an example of a cross-sectional view of a semiconductor laser driving apparatus 10 according to a fourth embodiment of the present technique.

FIG. 17 is a diagram for illustrating an example of a cross-sectional view of a semiconductor laser driving apparatus 10 according to the fourth embodiment of the present technique.

The solder bumps 301 are formed at the connection terminal portion of the semiconductor laser 300 as in the above-described third embodiment. In addition, similarly, other materials such as a copper (Cu) pillar bump and a gold (Au) bump may be used as the connection terminal portion.

The connection terminal portion of the semiconductor laser 300 is surrounded by a CUF 630. As a material of the CUF 630, for example, a thermosetting resin is assumed. It should be noted that the CUF 630 is an example of the sealing portion described in the claims.

The side walls 600 are formed around the semiconductor laser 300 mounted on the surface of the substrate 100, as in the above-described first embodiment. Further, the recessed portions of the side walls 600 are filled with the heat storage material 610 as in the above-described first embodiment.

As described above, according to the fourth embodiment of the present technique, it is possible to prevent the temperature of the entire semiconductor laser driving apparatus 10 from rising by using the CUF 630 at the connection terminal portion and filling the recessed portions of the side walls 600 with the heat storage material 610.

5. Application Example

[Electronic Equipment]

Figure 18:
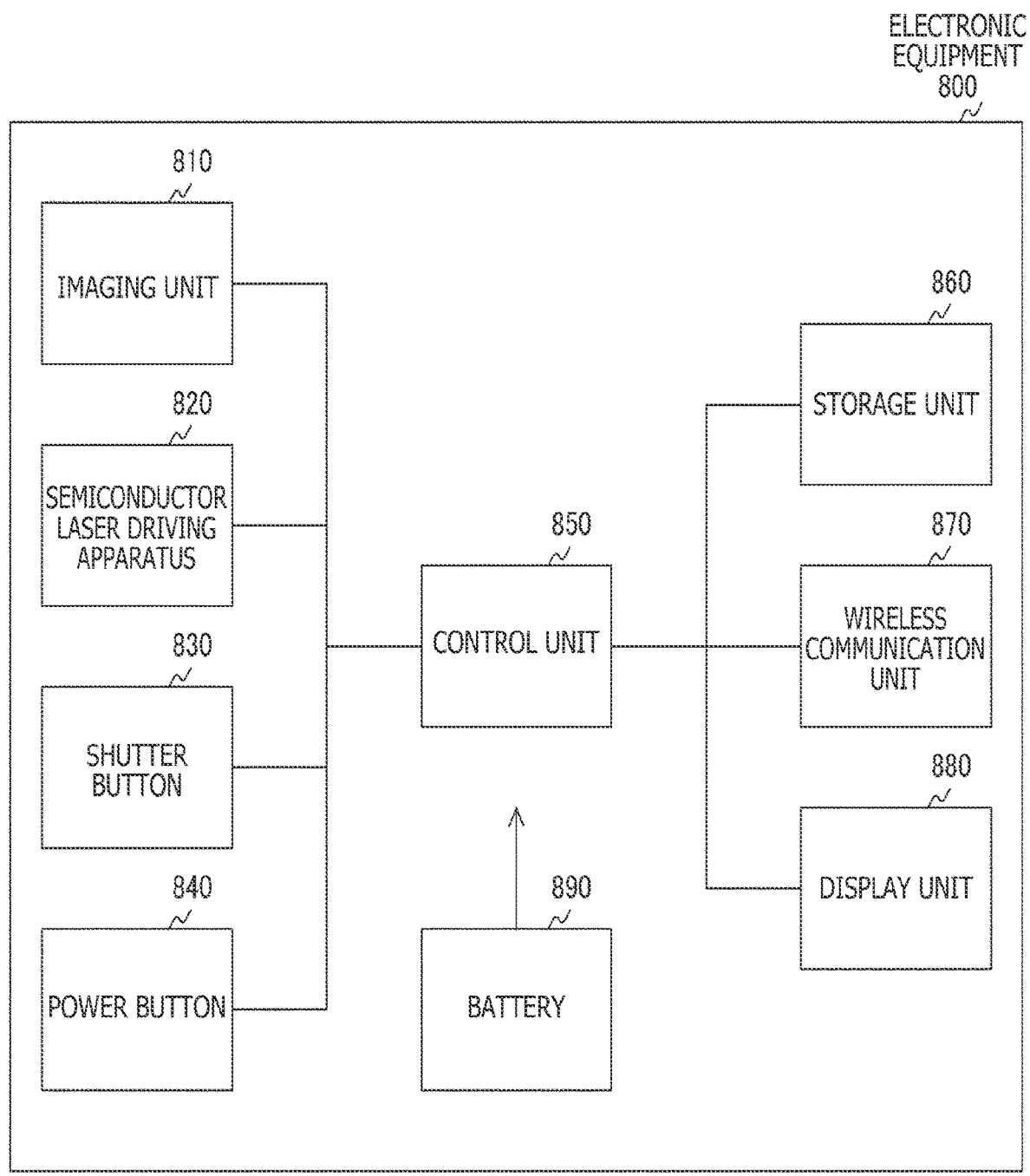
FIG. 18 is a diagram for illustrating a system configuration example of electronic equipment 800 as an application example of the embodiments of the present technique.

FIG. 18 is a diagram for illustrating a system configuration example of electronic equipment 800 as an application example of the embodiments of the present technique.

The electronic equipment 800 is a portable terminal in which the semiconductor laser driving apparatus 10 according to the above-described embodiments is mounted. The electronic equipment 800 includes an imaging unit 810, a semiconductor laser driving apparatus 820, a shutter button 830, a power button 840, a control unit 850, a storage unit 860, a wireless communication unit 870, a display unit 880, and a battery 890.

The imaging unit 810 is an image sensor for imaging a subject. The semiconductor laser driving apparatus 820 is the semiconductor laser driving apparatus 10 according to the above-described embodiments.

The shutter button 830 is a button for giving an instruction on an imaging timing in the imaging unit 810 from the outside of the electronic equipment 800. The power button 840 is a button for giving an instruction on on/off of the power of the electronic equipment 800 from the outside of the electronic equipment 800.

The control unit 850 is a processing unit that controls the entire electronic equipment 800. The storage unit 860 is a memory for storing data and programs necessary for the operation of the electronic equipment 800. The wireless communication unit 870 performs wireless communication with the outside of the electronic equipment 800. The display unit 880 is a display for displaying an image or the like. The battery 890 is a power supply source for supplying power to each unit of the electronic equipment 800.

The imaging unit 810 detects the light receiving amount from 0 to 180 degrees as Q1 and detects the light receiving amount from 180 to 360 degrees as Q2 with a specific phase (for example, rising timing) of a light emission control signal for controlling the semiconductor laser driving apparatus 820 defined as 0 degree. In addition, the imaging unit 810 detects the light receiving amount from 90 to 270 degrees as Q3 and detects the light receiving amount from 270 to 90 degrees as Q4. The control unit 850 computes a distance d to an object by the following equation on the basis of these light receiving amounts Q1 to Q4, and displays the distance d on the display unit 880.

$$d=(c/4\pi f)\times\arctan\{(Q3-Q4)/(Q1-Q2)\}$$

The unit of the distance d in the above equation is, for example, meters (m). In the equation, c is the speed of light, and the unit thereof is, for example, meters per second (m/s). In the equation, arctan is the inverse function of a tangent function. The value of "(Q3−Q4)/(Q1−Q2)" indicates a phase difference between the irradiated light and the reflected light. In the equation, n indicates the ratio of the circumference of a circle to its diameter. In addition, f is the frequency of the irradiated light, and the unit thereof is, for example, megahertz (MHz).

FIG. 19 is a diagram for illustrating an external configuration example of the electronic equipment 800 as an application example of the embodiments of the present technique.

The electronic equipment 800 is housed in a housing 801, includes the power button 840 on a side surface, and includes the display unit 880 and the shutter button 830 on the front surface. In addition, optical regions of the imaging unit 810 and the semiconductor laser driving apparatus 820 are provided on the rear surface.

Accordingly, the display unit 880 can display not only a normal captured image 881 but also a depth image 882 according to the distance measurement result using ToF.

It should be noted that, in the application example, a portable terminal such as a smartphone is exemplified as the electronic equipment 800, but the electronic equipment 800 is not limited thereto, and may be, for example, a digital camera, a game machine, wearable equipment, or the like.

It should be noted that the above-described embodiments illustrate an example for embodying the present technique, and the matters in the embodiments have corresponding relations with the matters specifying the invention in the claims. Similarly, the matters specifying the invention in the claims have corresponding relations with the matters in the embodiments of the present technique to which the same names are given. However, the present technique is not limited to the embodiments, and can be embodied by applying various modifications to the embodiments without departing from the gist thereof.

It should be noted that the effects described in the specification are merely illustrative and not limitative, and other effects may be provided.

It should be noted that the present technique can also be configured as follows.

(1) A semiconductor laser driving apparatus including:
a substrate incorporating a laser driver;
a semiconductor laser mounted on one surface of the substrate;
connection wiring that electrically connects the laser driver and the semiconductor laser to each other with a wiring inductance of 0.5 nanohenries or less; and
side walls having a heat storage material therein while surrounding a region including the semiconductor laser on the one surface of the substrate.

(2) The semiconductor laser driving apparatus according to (1),
in which the heat storage material causes a phase change below a limit temperature at which the semiconductor laser driving apparatus is usable.

(3) The semiconductor laser driving apparatus according to (1) or (2),
in which the heat storage material is vanadium oxide.

(4) The semiconductor laser driving apparatus according to (1) or (2),
in which the heat storage material is a paraffin-based heat storage material.

(5) The semiconductor laser driving apparatus according to (1) or (2),
in which the heat storage material is a PCM (Phase Change Material) sheet.

(6) The semiconductor laser driving apparatus according to any one of (1) to (5),
in which a bonding wire is formed at a connection terminal portion of the semiconductor laser for the substrate, and
the side walls cover a region including the bonding wire.

(7) The semiconductor laser driving apparatus according to any one of (1) to (6),
in which the connection wiring has a length of 0.5 millimeters or less.

(8) The semiconductor laser driving apparatus according to any one of (1) to (7),
in which the connection wiring is provided via a connection via provided in the substrate.

(9) The semiconductor laser driving apparatus according to any one of (1) to (8),
in which the semiconductor laser is arranged in such a manner that a part thereof overlaps an upper part of the laser driver.

(10) The semiconductor laser driving apparatus according to (9),
in which the semiconductor laser is arranged in such a manner that a part corresponding to 50% or less of an area thereof overlaps the upper part of the laser driver.

(11) The semiconductor laser driving apparatus according to any one of (1) to (10), further including:
a diffusion plate covering an upper part of a region surrounded by the side walls.

(12) Electronic equipment including:
a substrate incorporating a laser driver;
a semiconductor laser mounted on one surface of the substrate;
connection wiring that electrically connects the laser driver and the semiconductor laser to each other with a wiring inductance of 0.5 nanohenries or less; and
side walls having a heat storage material therein while surrounding a region including the semiconductor laser on the one surface of the substrate.

(13) A manufacturing method of a semiconductor laser driving apparatus, including:
a step of forming a laser driver on an upper surface of a support plate;
a step of forming a substrate incorporating the laser driver by forming connection wiring of the laser driver;
a step of mounting a semiconductor laser on one surface of the substrate and forming connection wiring that electrically connects the laser driver and the semiconductor laser to each other via the connection wiring with a wiring inductance of 0.5 nanohenries or less; and
a step of forming side walls having a heat storage material therein while surrounding a region including the semiconductor laser on the one surface of the substrate.

REFERENCE SIGNS LIST

10: Semiconductor laser driving apparatus
100: Substrate
101: Connection via
110: Support plate
120: Adhesive resin layer
130: Peelable copper foil
131: Carrier copper foil
132: Ultra-thin copper foil
140: Solder resist
150: Wiring pattern
161 to 163: Interlayer insulating resin
170 to 172: Via hole
180: Solder resist
200: Laser driver
210: I/O pad
220: Protective insulating layer
230: Surface protective film
240: Adhesion layer and seed layer
250: Photoresist
260: Copper land and copper redistribution layer (RDL)
290: Die attach film (DAF)
300: Semiconductor laser
302: Bonding wire
400: Photodiode
500: Passive component
600: Side wall
610: Heat storage material
620: MUF (Mold UnderFill)
630: CUF (Capillary UnderFill)
700: Diffusion plate
800: Electronic equipment
801: Housing
810: Imaging unit
820: Semiconductor laser driving apparatus
830: Shutter button
840: Power button
850: Control unit
860: Storage unit
870: Wireless communication unit
880: Display unit
890: Battery

What is claimed is:

1. A semiconductor laser driving apparatus, comprising:
a substrate incorporating a laser driver;
a semiconductor laser mounted on one surface of the substrate;
connection wiring that electrically connects the laser driver and the semiconductor laser to each other,
wherein the connection wiring has a wiring inductance of 0.5 nanohenries or less; and
side walls having a heat storage material therein,
wherein the side walls surround a region including the semiconductor laser on the one surface of the substrate, and
wherein a sealing portion forms the side walls.

2. The semiconductor laser driving apparatus according to claim 1, wherein the heat storage material causes a phase change below a limit temperature at which the semiconductor laser driving apparatus is usable.

3. The semiconductor laser driving apparatus according to claim 1, wherein the heat storage material is vanadium oxide.

4. The semiconductor laser driving apparatus according to claim 1, wherein the heat storage material is a paraffin-based heat storage material.

5. The semiconductor laser driving apparatus according to claim 1, wherein the heat storage material is a Phase Change Material (PCM) sheet.

6. The semiconductor laser driving apparatus according to claim 1, wherein a bonding wire is formed at a connection terminal portion of the semiconductor laser for the substrate, and the side walls cover a region including the bonding wire.

7. The semiconductor laser driving apparatus according to claim 6, wherein the sealing portion seals the connection terminal portion of the semiconductor laser for the substrate.

8. The semiconductor laser driving apparatus according to claim 7, wherein a bump is formed at the connection terminal portion of the semiconductor laser, and the sealing portion is a mold underfill covering a region including the bump.

9. The semiconductor laser driving apparatus according to claim 7, wherein the sealing portion is a capillary underfill.

10. The semiconductor laser driving apparatus according to claim 1, wherein the connection wiring has a length of 0.5 millimeters or less.

11. The semiconductor laser driving apparatus according to claim 1, wherein the connection wiring is provided via a connection via provided in the substrate.

12. The semiconductor laser driving apparatus according to claim 1, wherein the semiconductor laser is arranged in such a manner that a part thereof overlaps an upper part of the laser driver.

13. The semiconductor laser driving apparatus according to claim 12, wherein the semiconductor laser is arranged in such a manner that a part corresponding to 50% or less of an area thereof overlaps the upper part of the laser driver.

14. The semiconductor laser driving apparatus according to claim 1, further comprising: a diffusion plate covering an upper part of a region surrounded by the side walls.

15. Electronic equipment, comprising:
an optical system;
a semiconductor laser driving apparatus that receives light from the optical system, the semiconductor laser driving apparatus including:
a substrate incorporating a laser driver;
a semiconductor laser mounted on one surface of the substrate;
connection wiring that electrically connects the laser driver and the semiconductor laser to each other,
wherein the connection wiring has a wiring inductance of 0.5 nanohenries or less; and
side walls having a heat storage material therein,
wherein the side walls surround a region including the semiconductor laser on the one surface of the substrate,
wherein a sealing portion forms the side walls; and
a controller that processes signals from the semiconductor laser driving apparatus.

16. A manufacturing method of a semiconductor laser driving apparatus, comprising:
a step of forming a laser driver on an upper surface of a support plate;
a step of forming a substrate incorporating the laser driver by forming connection wiring of the laser driver;
a step of mounting a semiconductor laser on one surface of the substrate and forming connection wiring that electrically connects the laser driver and the semiconductor laser to each other via the connection wiring,
wherein the connection wiring has a wiring inductance of 0.5 nanohenries or less; and
a step of forming side walls having a heat storage material therein, wherein the side walls surround a region including the semiconductor laser on the one surface of the substrate, and wherein a sealing portion forms the side walls.

17. A semiconductor laser driving apparatus, comprising:
a substrate incorporating a laser driver;
a semiconductor laser mounted on one surface of the substrate in such a manner that at least a part thereof overlaps the laser driver; and
side walls having a heat storage material therein,
wherein the side walls surround a region including the semiconductor laser on the one surface of the substrate, and
wherein a sealing portion forms the side walls.

18. The semiconductor laser driving apparatus according to claim 17, wherein the heat storage material is vanadium oxide.

19. The semiconductor laser driving apparatus according to claim 17, wherein the heat storage material is a paraffin-based heat storage material.

20. The semiconductor laser driving apparatus according to claim 17, wherein the heat storage material is a Phase Change Material (PCM) sheet.

* * * * *